United States Patent
Chaponniere et al.

(10) Patent No.: US 9,100,890 B2
(45) Date of Patent: Aug. 4, 2015

(54) METHOD AND APPARATUS FOR MEDIA ACCESS CONTROL-BASED FAST CELL SWITCHING FOR HIGH-SPEED PACKET ACCESS

(71) Applicant: QUALCOMM Incorporated, San Diego, CA (US)

(72) Inventors: Etienne F. Chaponniere, Issy les Moulineaux (FR); Oronzo Flore, Rome (IT)

(73) Assignee: QUALCOMM Incorporated, San Diego, CA (US)

( * ) Notice: Subject to any disclaimer, the term of this patent is extended or adjusted under 35 U.S.C. 154(b) by 59 days.

(21) Appl. No.: 13/794,177

(22) Filed: Mar. 11, 2013

(65) Prior Publication Data
US 2013/0201856 A1    Aug. 8, 2013

Related U.S. Application Data

(62) Division of application No. 12/406,812, filed on Mar. 18, 2009.

(60) Provisional application No. 61/038,560, filed on Mar. 21, 2008.

(51) Int. Cl.
*H04W 4/00*      (2009.01)
*H04W 36/30*    (2009.01)
(Continued)

(52) U.S. Cl.
CPC .............. *H04W 36/30* (2013.01); *H04L 1/16* (2013.01); *H04W 36/02* (2013.01); *H01L 2924/00013* (2013.01); *H04W 28/04* (2013.01)

(58) Field of Classification Search
CPC ......... H04L 1/16; H04W 36/02; H04W 36/30

USPC .......................... 370/328, 332, 270, 338, 351
See application file for complete search history.

(56) References Cited

U.S. PATENT DOCUMENTS 6,456,606 B1    9/2002    Terasawa
6,944,426 B1    9/2005    Esser et al.
(Continued)

FOREIGN PATENT DOCUMENTS

CN    1479539 A    3/2004
EP    1458209 A2    9/2004
(Continued)

OTHER PUBLICATIONS

International Search Report and Written Opinion—PCT/US2009/037880—ISA/EPO—Aug. 6, 2009.
(Continued)

*Primary Examiner* — Ayaz Sheikh
*Assistant Examiner* — Hai-Chang Hsiung
(74) *Attorney, Agent, or Firm* — Charles Chesney

(57) ABSTRACT

Methods and apparatuses for facilitating switching HSPA (high speed packet access) serving cells from each of an RNC (radio network controller), base station, and access terminal are provided. The RNC pre-configures an access terminal and each base station in an active set for HS-DSCH operation by providing identification codes identifying each of the base stations. The RNC transmits data packets tagged with sequence numbers to each base station where they are synchronously buffered. The access terminal initiates a handover by transmitting a PDU (protocol data unit) to each of the base stations. The PDU is encoded with the identification code of a target base station and a sequence number of a subsequent packet. The target receives the PDU and directly completes the handover with the access terminal.

30 Claims, 17 Drawing Sheets

(51) Int. Cl.
*H04L 1/16* (2006.01)
*H04W 36/02* (2009.01)
*H04W 28/04* (2009.01)

(56) References Cited

U.S. PATENT DOCUMENTS

| | | |
|---|---|---|
| 2003/0095532 A1 | 5/2003 | Kim et al. |
| 2004/0029573 A1 | 2/2004 | Kim |
| 2004/0116108 A1 | 6/2004 | Ra |
| 2004/0235478 A1* | 11/2004 | Lindquist et al. ............ 455/440 |
| 2006/0007889 A1* | 1/2006 | Khan ............................ 370/331 |
| 2006/0068800 A1* | 3/2006 | Ruelke et al. ................. 455/450 |
| 2006/0240831 A1* | 10/2006 | Toskala et al. ................ 455/436 |
| 2006/0268788 A1* | 11/2006 | Harris et al. .................. 370/335 |
| 2007/0004437 A1 | 1/2007 | Harada et al. |
| 2007/0041382 A1 | 2/2007 | Vayanos et al. |
| 2007/0097918 A1* | 5/2007 | Cai et al. ...................... 370/331 |
| 2007/0110015 A1* | 5/2007 | Chakraborty et al. ........ 370/338 |
| 2007/0147245 A1* | 6/2007 | Foore et al. ................... 370/231 |
| 2007/0155388 A1 | 7/2007 | Petrovic et al. |
| 2008/0080063 A1 | 4/2008 | Katakura et al. |
| 2009/0238116 A1 | 9/2009 | Chaponniere et al. |

FOREIGN PATENT DOCUMENTS

| | | |
|---|---|---|
| EP | 1775968 A1 | 4/2007 |
| JP | 4234232 A | 8/1992 |
| JP | 2001509652 A | 7/2001 |
| JP | 2006025438 A | 1/2006 |
| JP | 2010501152 A | 1/2010 |
| KR | 20030035449 A | 5/2003 |
| RU | 2305902 C2 | 9/2007 |
| WO | 2007046764 A1 | 4/2007 |
| WO | WO-2007100108 A1 | 9/2007 |
| WO | 2008022523 A1 | 2/2008 |

OTHER PUBLICATIONS

Taiwan Search Report—TW098109262—TIPO—Jan. 23, 2013.

* cited by examiner

RADIO NETWORK CONTROLLER UNIT

PROCESSOR COMPONENT 410

MEMORY COMPONENT 420

ID CODE COMPONENT 430

CONFIG. COMPONENT 440

RECEIVING COMPONENT 450

TAGGING COMPONENT 460

TRANSMISSION COMPONENT 470

METHOD AND APPARATUS FOR MEDIA ACCESS CONTROL-BASED FAST CELL SWITCHING FOR HIGH-SPEED PACKET ACCESS

CROSS-REFERENCE TO RELATED APPLICATIONS

This application is a divisional of U.S. patent application Ser. No. 12/406,812, entitled "METHOD AND APPARATUS FOR MEDIA ACCESS CONTROL BASED FAST CELL SWITCHING FOR HIGH-SPEED PACKET ACCESS," filed Mar. 18, 2009, which claims the benefit of U.S. Provisional Patent Application Ser. No. 61/038,560 entitled "MAC-BASED FAST CELL SWITCHING FOR HSPA," filed Mar. 21, 2008.

BACKGROUND

I. Field

The present application relates generally to wireless communications, and more specifically to methods and systems to enable Media Access Control (MAC) based High-Speed Packet Access (HSPA) fast cell switching within a network.

II. Background

Wireless communication systems are widely deployed to provide various types of communication; for instance, voice and/or data can be provided via such wireless communication systems. A typical wireless communication system, or network, can provide multiple users access to one or more shared resources (e.g., bandwidth, transmit power, etc.). For instance, a system can use a variety of multiple access techniques such as Frequency Division Multiplexing (FDM), Time Division Multiplexing (TDM), Code Division Multiplexing (CDM), Orthogonal Frequency Division Multiplexing (OFDM), High Speed Packet (HSPA, HSPA+), and others. Moreover, wireless communication systems can be designed to implement one or more standards, such as IS-95, CDMA2000, IS-856, W-CDMA, TD-SCDMA, and the like.

Generally, a wireless multiple-access communication system can simultaneously support communication for multiple wireless terminals. In such a system, each terminal can communicate with one or more base stations via transmissions on the forward and reverse links. The forward link (or downlink) refers to the communication link from the base stations to the terminals, and the reverse link (or uplink) refers to the communication link from the terminals to the base stations. This communication link can be established via a single-in-single-out (SISO), multiple-in-signal-out (MISO), or a multiple-in-multiple-out (MIMO) system.

An access terminal operating in a wireless communication system can change from the coverage of a first (e.g., source) cell to the coverage of a second (e.g., target) cell using a handover operation. For example, a terminal can initiate communications to request, and subsequently establish a connection with the target cell during a handover. With respect to the HSPA serving cell change procedure, particular concerns have been raised both in terms of reliability and latency. Moreover, it is unclear if the existing HSPA procedure can provide a sufficient grade of service for low latency real-time applications such as voice. Since it is anticipated that most voice traffic will be carried over HSPA in the future, it would thus be desirable to have a low-latency method and apparatus for reliably switching HSPA serving cells.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In accordance with one or more embodiments and corresponding disclosure thereof, various aspects are described in connection with facilitating switching HSPA serving cells. In one aspect, a method, apparatus, and computer program product is disclosed for facilitating switching HSPA serving cells from a base station. Within such embodiment, the base station receives configuration data including an identification code assigned to the base station from an RNC (radio network controller). A sequence of data packets, in which each of the data packets is tagged with a particular sequence number, is also received from the RNC. The base station also receives each of a series of PDUs (protocol data units) from an access terminal in which each of the PDUs is encoded with a particular identification code and a particular sequence number. The data packets are then transmitted to the access terminal as a function of the identification code and sequence number encoded in each PDU.

In another aspect, a method, apparatus, and computer program product is disclosed for facilitating switching HSPA serving cells from an access terminal. Within such embodiment, an access terminal receives configuration data that includes a set of identification codes in which each identification code is assigned to a particular base station in an active set. The access terminal also receives a first set of data packets sequentially from a source base station. For this embodiment, the first set of data packets is a subset of a series of data packets in which each data packet in the series includes a sequence number. A target base station is then selected as a function of a signal quality ascertained for each of the base stations in the active set. The access terminal then transmits a PDU to each of the base stations. The PDU is encoded with an identification code corresponding to the target base station and a sequence number corresponding to a subsequent data packet. A handover procedure is then performed as a function of whether a second set of data packets is received from the target base station. Here, the second set of data packets is a subset of the series of data packets in which the second set of data packets begins with the subsequent data packet.

In yet another aspect, a method and apparatus is disclosed for facilitating switching HSPA serving cells from an RNC. Within such embodiment, the RNC identifies base stations comprising an active set for an access terminal and generates an identification code for each of the base stations. The RNC also pre-configures the access terminal and the plurality of base stations. The pre-configuration of the access terminal includes providing the access terminal with the identification code for each of the base stations. The pre-configuration of the base stations respectively providing each base station with its corresponding identification code. The RNC also transmits a sequence of data packets simultaneously to each of the base stations in which each of the data packets is tagged with a sequence number.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments can be employed and the described embodiments are intended to include all such aspects and their equivalents.

BRIEF DESCRIPTION OF THE DRAWINGS

FIG. 4 is a block diagram of an exemplary radio network control unit in accordance with an embodiment.

DETAILED DESCRIPTION

Figure 1:
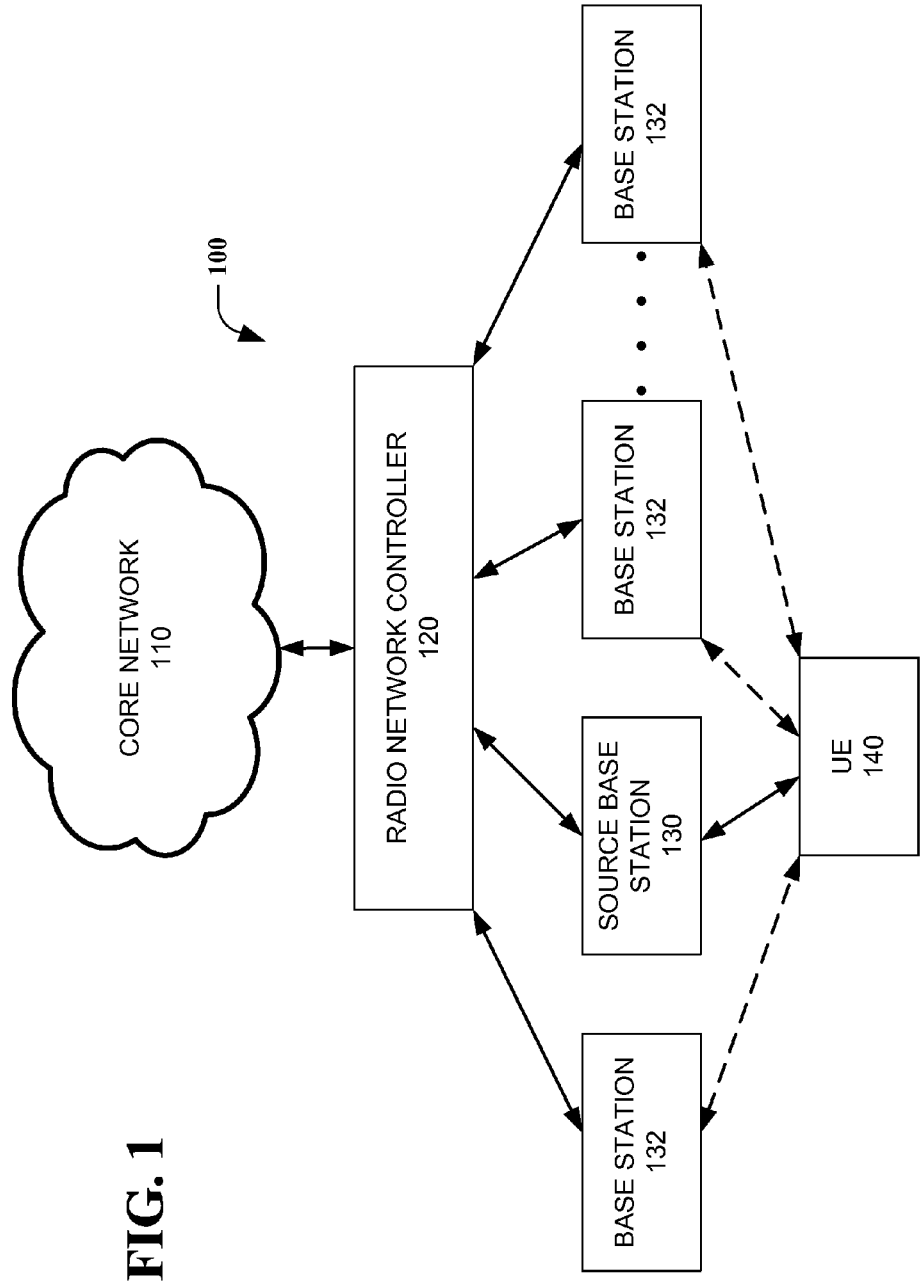
FIG. 1 is an illustration of an exemplary wireless communication system for facilitating switching HSPA serving cells in accordance with an embodiment.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

The techniques described herein can be used for various wireless communication systems such as code division multiple access (CDMA), time division multiple access (TDMA), frequency division multiple access (FDMA), orthogonal frequency division multiple access (OFDMA), single carrier-frequency division multiple access (SC-FDMA), High Speed Packet Access (HSPA), and other systems. The terms "system" and "network" are often used interchangeably. A CDMA system can implement a radio technology such as Universal Terrestrial Radio Access (UTRA), CDMA2000, etc. UTRA includes Wideband-CDMA (W-CDMA) and other variants of CDMA. CDMA2000 covers IS-2000, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is an upcoming release of UMTS that uses E-UTRA, which employs OFDMA on the downlink and SC-FDMA on the uplink.

Single carrier frequency division multiple access (SC-FDMA) utilizes single carrier modulation and frequency domain equalization. SC-FDMA has similar performance and essentially the same overall complexity as those of an OFDMA system. A SC-FDMA signal has lower peak-to-average power ratio (PAPR) because of its inherent single carrier structure. SC-FDMA can be used, for instance, in uplink communications where lower PAPR greatly benefits access terminals in terms of transmit power efficiency. Accordingly, SC-FDMA can be implemented as an uplink multiple access scheme in 3GPP Long Term Evolution (LTE) or Evolved UTRA.

High speed packet access (HSPA) can include high speed downlink packet access (HSDPA) technology and high speed uplink packet access (HSUPA) or enhanced uplink (EUL) technology and can also include HSPA+ technology. HSDPA, HSUPA and HSPA+ are part of the Third Generation Partnership Project (3GPP) specifications Release 5, Release 6, and Release 7, respectively.

High speed downlink packet access (HSDPA) optimizes data transmission from the network to the user equipment (UE). As used herein, transmission from the network to the user equipment UE can be referred to as the "downlink" (DL). Transmission methods can allow data rates of several Mbits/s. High speed downlink packet access (HSDPA) can increase the capacity of mobile radio networks. High speed uplink packet access (HSUPA) can optimize data transmission from the terminal to the network. As used herein, transmissions from the terminal to the network can be referred to as the "uplink" (UL). Uplink data transmission methods can allow data rates of several Mbit/s. HSPA+ provides even further improvements both in the uplink and downlink as specified in Release 7 of the 3GPP specification. High speed packet access (HSPA) methods typically allow for faster interactions between the downlink and the uplink in data services transmitting large volumes of data, for instance Voice over IP (VoIP), videoconferencing and mobile office applications Fast data transmission protocols such as hybrid automatic repeat request, (HARQ) can be used on the uplink and downlink. Such protocols, such as hybrid automatic repeat request (HARQ), allow a recipient to automatically request retransmission of a packet that might have been received in error.

Various embodiments are described herein in connection with an access terminal. An access terminal can also be called a system, subscriber unit, subscriber station, mobile station, mobile, remote station, remote terminal, mobile device, user terminal, terminal, wireless communication device, user agent, user device, or user equipment (UE). An access terminal can be a cellular telephone, a cordless telephone, a Session Initiation Protocol (SIP) phone, a wireless local loop (WLL) station, a personal digital assistant (PDA), a handheld device having wireless connection capability, computing device, or other processing device connected to a wireless modem. Moreover, various embodiments are described herein in connection with a base station. A base station can be utilized for communicating with access terminal(s) and can also be referred to as an access point, Node B, Evolved Node B (eNodeB) or some other terminology.

Referring next to FIG. 1, an illustration of an exemplary wireless communication system for facilitating switching HSPA serving cells in accordance with an embodiment is provided. As illustrated, system 100 may include a radio network controller (RNC) 120 in communication with core network 110 and each of a plurality of base stations 130 and 132 in an active set. Within such embodiment, RNC 120 receives downlink data packets from core network 110 and relays them to UE 140 via base stations 130 and 132. For this particular example, although base station 132 is shown to be the current source base station, UE 140 may subsequently request a cell change to one of base stations 130. Here, it should be noted that HSPA protocol limits the number of base stations in an active set to four. Nevertheless, it should be further noted that the disclosed subject matter is not limited to any particular number of base stations.

Figure 2:
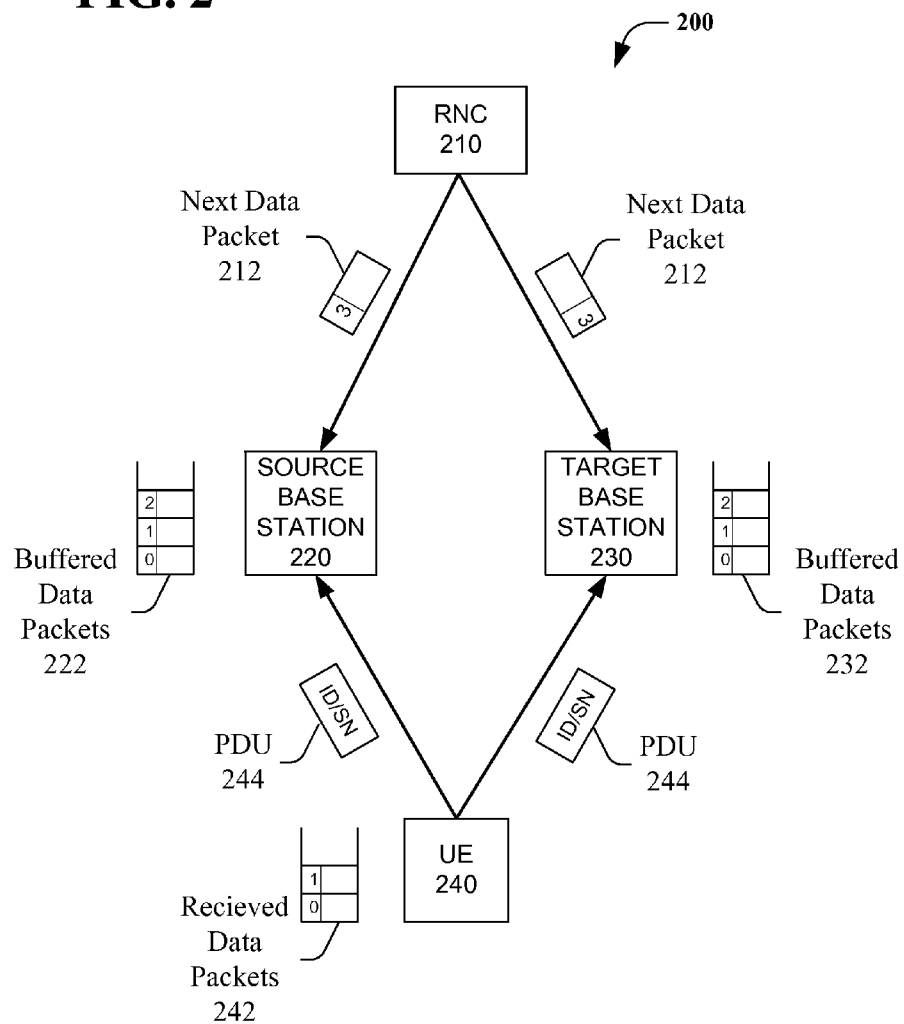
FIG. 2 is an illustration of an exemplary HSPA serving cell change procedure in accordance with an embodiment.

Turning now to FIG. 2, an illustration of an exemplary HSPA serving cell change procedure in accordance with an embodiment is provided. As illustrated, system 200 includes an RNC 210 in communication with source base station 220 and target base station 230, wherein each of source base station 220 and target base station 230 are in communication with UE 240. Within such embodiment, downlink data packets received by RNC 210 from the core network are tagged with a sequence number and subsequently transmitted to each of source base station 220 and target base station 230. Moreover, the tagged data packets 212 are sequentially transmitted by RNC 210, wherein data packets received at base stations 220 and 230 are respectively buffered, 222 and 232, according to sequence number and subsequently transmitted to UE 240.

In an aspect, as data packets are received 242, UE 240 monitors the signal strength from each of source base station 220 and target base station 230 to ascertain whether a cell change request should be made. If a cell change is desired, a request for such a change is facilitated by encoding a protocol data unit (PDU). Within such embodiment, UE 240 encodes the PDU so as to identify the desired target cell and the subsequently desired data packet. For instance, if a cell change request is made under the circumstances of the illustrated example, UE 240 may encode a PDU 244 so as to identify target base station 230 and the 'second' data packet of the sequence of data packets. PDU 244 is then transmitted to each of source base station 220 and target base station 230 where, assuming PDU 244 has been successfully received at target base station 230, UE 240 will begin receiving data packets from target base station 230.

Figure 3:
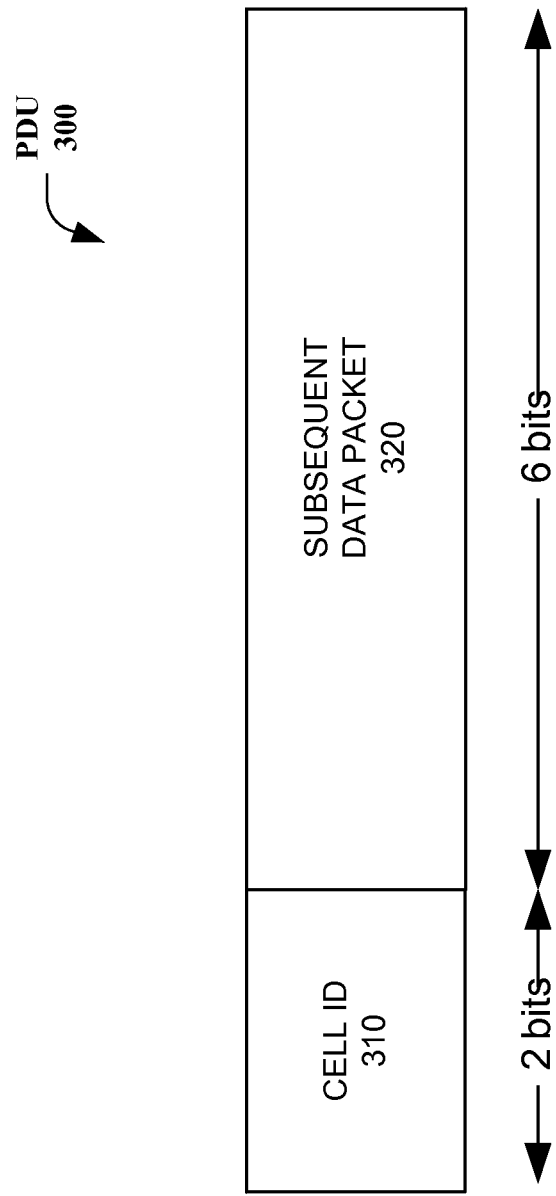
FIG. 3 is an illustration of an exemplary structure for a PDU according to one embodiment.

It should be appreciated that a PDU may be configured in any of a plurality of ways. In FIG. 3, an illustration of an exemplary structure for a PDU according to an embodiment is provided. As illustrated, PDU 300 may be defined as an 8-bit MAC Control PDU, wherein the fields of the PDU may include a 2-bit field for identifying a cell ID 310 and a 6-bit field for identifying a subsequent data packet 320. Within such embodiment, subsequent data packet 320 may be identified by providing the six least significant bits of the sequence number. In an alternative embodiment, subsequent data packet 320 is configured by UTRAN if bi-casting is performed over Iub/Iur.

Referring next to FIG. 4, a block diagram of an exemplary RNC unit in accordance with an embodiment is provided. As illustrated, RNC unit 400 may include processor component 410, memory component 420, identification code component 430, configuration component 440, receiving component 450, tagging component 460, and transmission component 470.

In one aspect, processor component 410 is configured to execute computer-readable instructions related to performing any of a plurality of functions. Processor component 410 can be a single processor or a plurality of processors dedicated to analyzing information to be communicated from RNC unit 400 and/or generating information that can be utilized by memory component 420, identification code component 430, configuration component 440, receiving component 450, tagging component 460, and/or transmission component 470. Additionally or alternatively, processor component 410 may be configured to control one or more components of RNC unit 400.

In another aspect, memory component 420 is coupled to processor component 410 and configured to store computer-readable instructions executed by processor component 410. Memory component 420 may also be configured to store any of a plurality of other types of data including data generated by any of identification code component 430, configuration component 440, receiving component 450, tagging component 460, and/or transmission component 470. Memory component 420 can be configured in a number of different configurations, including as random access memory, battery-backed memory, hard disk, magnetic tape, etc. Various features can also be implemented upon memory component 420, such as compression and automatic back up (e.g., use of a Redundant Array of Independent Drives configuration).

As illustrated, RNC unit 400 also includes identification code component 430. Within such embodiment, identification code component 430 is configured to generate a unique identification code for each base station in an active set. Here, it should be noted that the bit-length of the identification codes may be designed to be proportional to the number of base stations in an active set (e.g., a two-bit identification code may be used for an active set having four base stations).

In an aspect, configuration component 440 is configured to provide data for pre-configuring a UE and cells in an active set for HS-DSCH operation with MAC-FCS. To this end, configuration component 440 may be configured to store and/or generate such data, wherein aspects of the UE configuration data may differ from the base station configuration data. Data for the UE, for example, may include the identification code for each of the base stations; instructions for determining the signal quality of a base station (e.g., instructions for continuously/periodically sampling signals from each base station); and instructions for completing a handover (e.g., a time threshold for cancelling a handover procedure). On the other hand, the configuration data for each base station may include the particular identification code assigned to the base station, and instructions for discarding data packets (e.g., instructions for discarding data packets already received by the UE).

In another aspect, receiving component 450 and transmission component 470 are coupled to processor component 410 and configured to interface RNC unit 400 with external entities. For instance, receiving component 450 may be configured to receive data packets from a core communication network, whereas transmission component 470 may be configured to transmit the received data packets, as well as stored/generated configuration data, to any of the base stations in the active set.

In yet another aspect, RNC unit 400 further includes tagging component 460. Within such embodiment, tagging component 460 tags each data packet with a sequence number prior to transmission to the base stations. Moreover, because the data packets are uniformly transmitted to each base station in a particular order, each data packet is tagged to include a sequence number identifying the sequential location of each data packet in that order.

Figure 5:
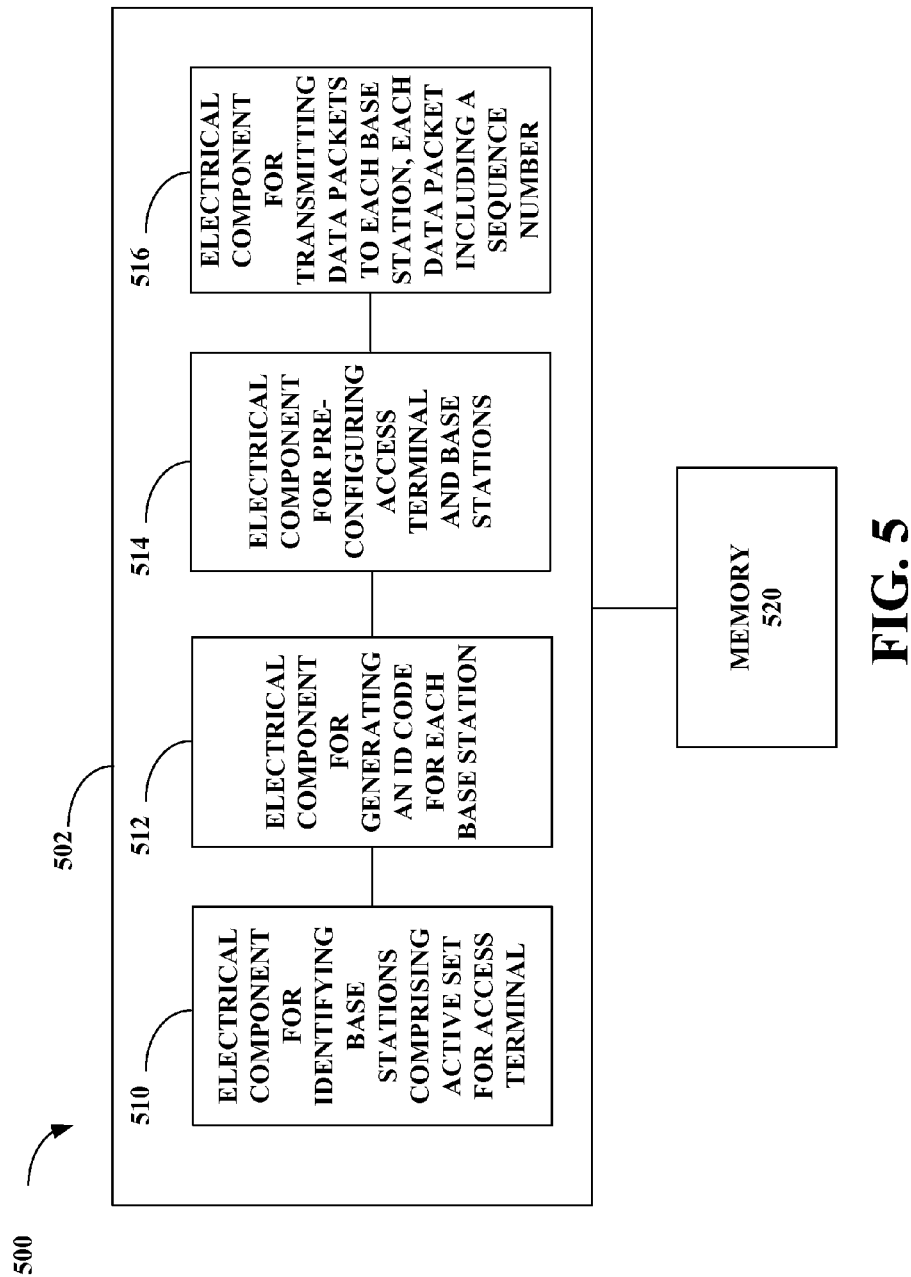
FIG. 5 is an illustration of an exemplary coupling of electrical components that effectuate switching HSPA serving cells from a radio network controller.

Turning to FIG. 5, illustrated is a system 500 that facilitates switching HSPA serving cells in a wireless communication environment. System 500 can reside within a radio network controller, for instance. As depicted, system 500 includes functional blocks that can represent functions implemented by a processor, software, or combination thereof (e.g., firmware). System 500 includes a logical grouping 502 of electrical components that can act in conjunction. As illustrated, logical grouping 502 can include an electrical component for identifying base stations comprising an active set for an access terminal 510. Further, logical grouping 502 can include an electrical component for generating an identification code for each base station in the active set 512. Logical grouping 502 can also include an electrical component for pre-configuring the access terminal and the base stations 514, as well as an electrical component for transmitting data packets to each base station, wherein each data packet is tagged with a sequence number 516. Additionally, system 500 can include a memory 520 that retains instructions for executing functions associated with electrical components 510, 512, 514, and 516. While shown as being external to memory 520, it is to be understood that electrical components 510, 512, 514, and 516 can exist within memory 520.

Figure 6:
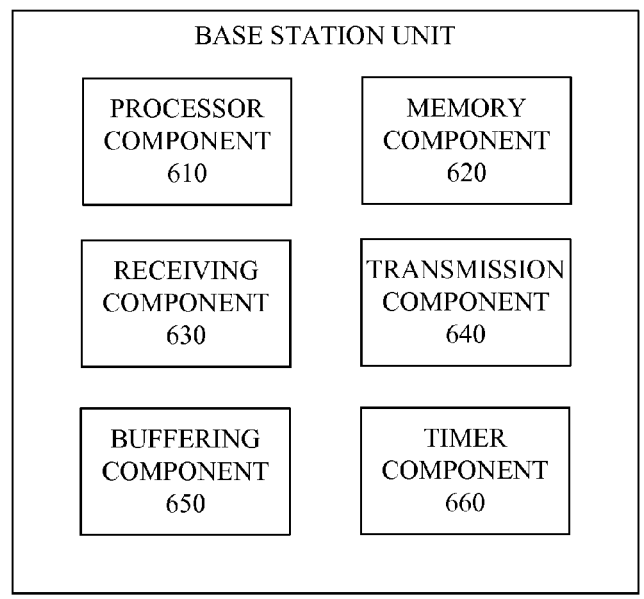
FIG. 6 is a block diagram of an exemplary base station unit in accordance with an embodiment.

Referring next to FIG. 6, a block diagram of an exemplary base station unit in accordance with an embodiment is provided. As illustrated, base station unit 600 may include processor component 610, memory component 620, receiving component 630, transmission component 640, buffering component 650, and timing component 660.

Similar to processor component 410 in RNC unit 400, processor component 610 is configured to execute computer-readable instructions related to performing any of a plurality of functions. Processor component 610 can be a single processor or a plurality of processors dedicated to analyzing information to be communicated from base station unit 600 and/or generating information that can be utilized by memory component 620, receiving component 630, transmission component 640, buffering component 650, and/or timing component 660. Additionally or alternatively, processor component 610 may be configured to control one or more components of base station unit 600.

In another aspect, memory component 620 is coupled to processor component 610 and configured to store computer-readable instructions executed by processor component 610. Memory component 620 may also be configured to store any of a plurality of other types of data including data generated by any of receiving component 630, transmission component 640, buffering component 650, and/or timing component 660. Here, it should be noted that memory component 620 is analogous to memory component 420 in RNC unit 400. Accordingly, it should be appreciated that any of the aforementioned features/configurations of memory component 420 are also applicable to memory component 620.

In an aspect, receiving component 630 and transmission component 640 are coupled to processor component 610 and configured to interface base station unit 600 with external entities. For instance, receiving component 630 may be configured to receive data packets and configuration data from an RNC, whereas transmission component 640 may be configured to transmit the received data packets to a particular UE.

As illustrated, base station unit 600 also includes buffering component 650. Within such embodiment, buffering component 650 is configured to sequentially buffer each of the data packets received from an RNC. Here, although the buffer size of buffering component 650 may vary amongst base stations, the actual buffering process of each base station may be synchronized according to instructions provided during the active set update procedure (i.e., via configuration data provided by an RNC). For instance, each base station may be instructed to sequentially buffer each data packet according to its corresponding sequence number, wherein data packets are uniformly discarded according to information provided in each PDU (e.g., information indicating which data packets have already been received by the UE).

Base station unit 600 may also include timing component 660. In an aspect, timing component 660 is configured to determine when a source base station should stop transmitting data packets to a particular UE. For instance, rather than simply ceasing to transmit data packets upon receiving a PDU identifying a different base station, base station unit 600 may be configured to continue transmitting data packets until ACK/NACK signals are no longer received from the UE (i.e., in case the handover is unsuccessful). Within such embodiment, timing component 660 may be utilized by a source base station to determine whether a threshold amount of time has elapsed since the last ACK/NACK signal was received.

Figure 7:
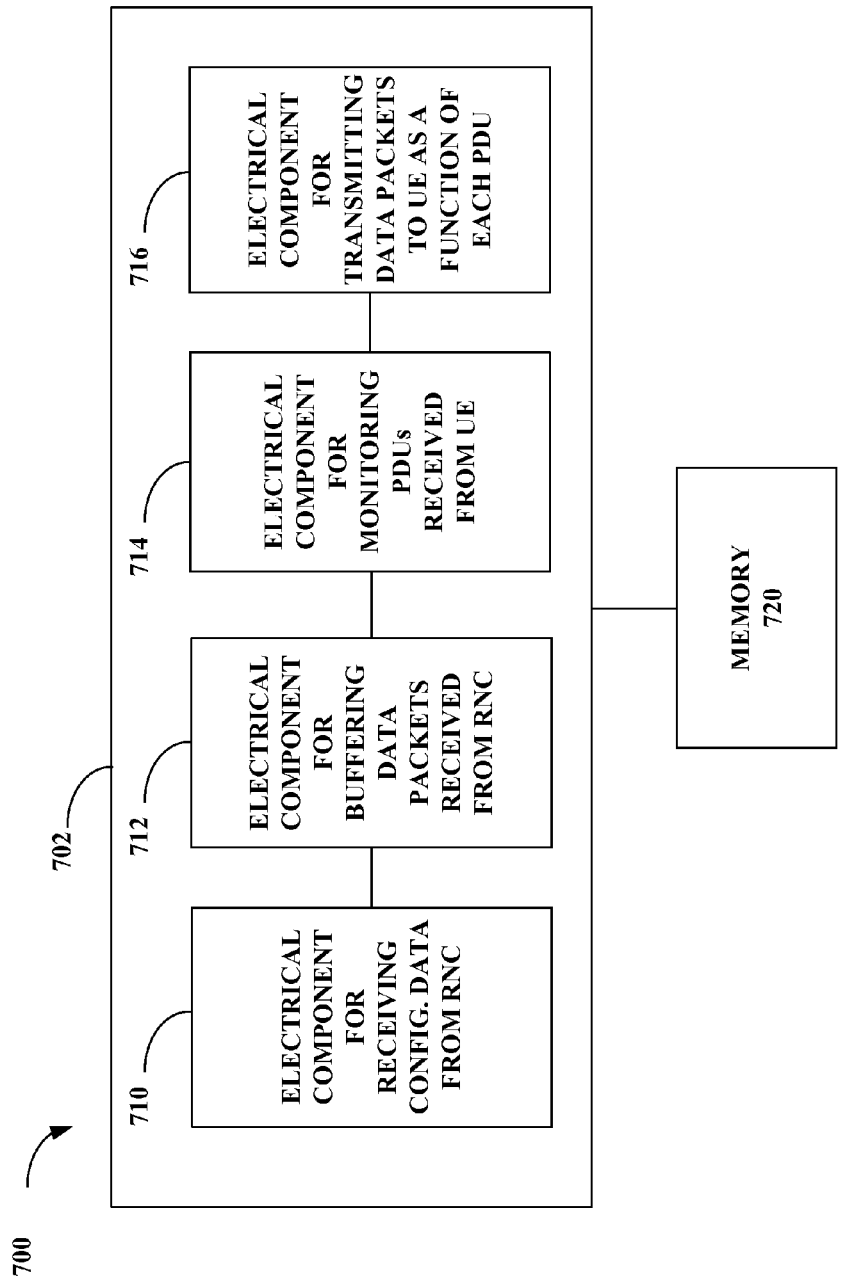
FIG. 7 is an illustration of an exemplary coupling of electrical components that effectuate switching HSPA serving cells from a base station.

Referring next to FIG. 7, illustrated is another system 700 that facilitates switching HSPA serving cells in a wireless communication environment. System 700 can reside within a base station, for instance. Similar to system 500, system 700 includes functional blocks that can represent functions implemented by a processor, software, or combination thereof (e.g., firmware), wherein system 700 includes a logical grouping 702 of electrical components that can act in conjunction. As illustrated, logical grouping 702 can include an electrical component for receiving configuration data from an RNC 710. Further, logical grouping 702 can include an electrical component for buffering data packets received from the RNC 712. Logical grouping 702 can also include an electrical component for monitoring PDUs received from an access terminal 714, as well as an electrical component for transmitting data packets to the access terminal as a function of each PDU 716. Additionally, system 700 can include a memory 720 that retains instructions for executing functions associated with electrical components 710, 712, 714, and 716, wherein any of electrical components 710, 712, 714, and 716 can exist either within or outside memory 720.

Figure 8:
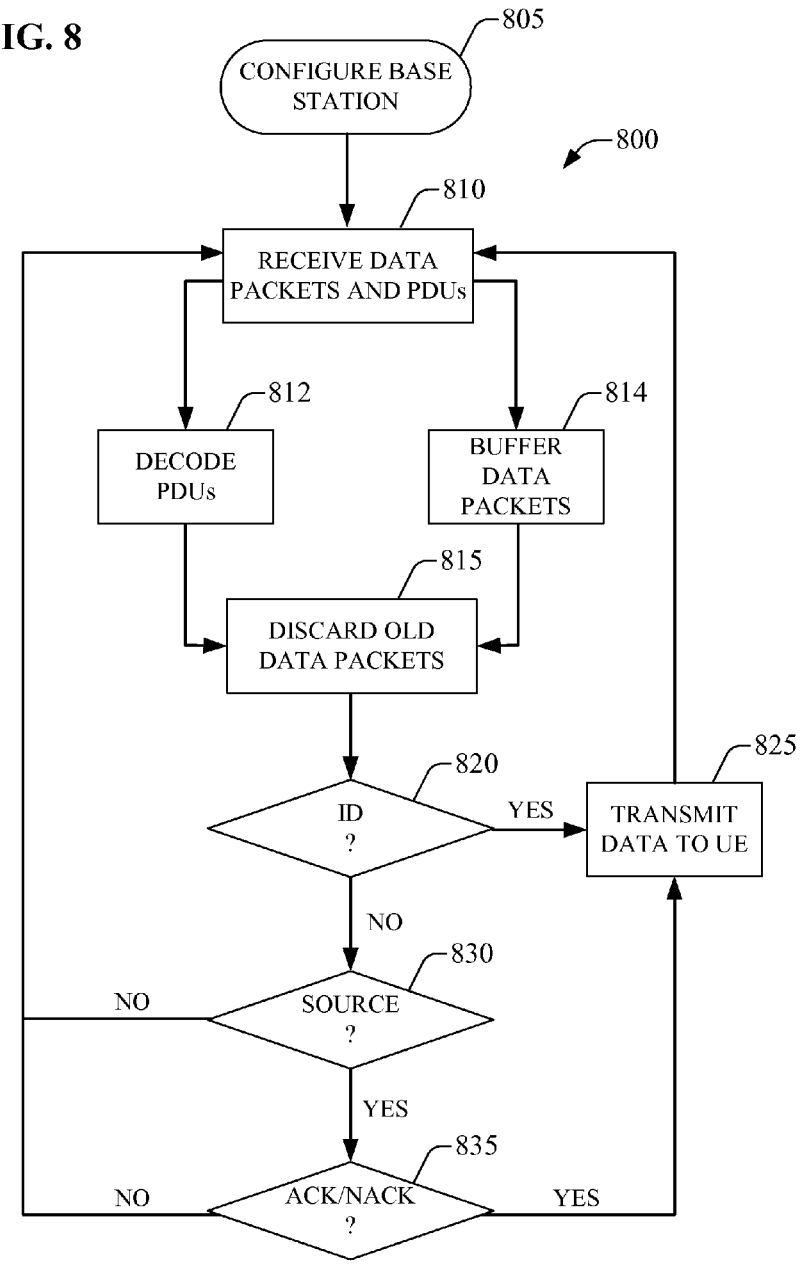
FIG. 8 is a flow chart illustrating an exemplary methodology for facilitating switching HSPA serving cells from a base station.

In FIG. 8, a flow chart is provided illustrating an exemplary methodology for facilitating switching HSPA serving cells from a base station. As illustrated, process 800 begins at step 805 where the base station is configured for HS-DSCH operation with MAC-FCS. Once configured, process 800 continues to step 810 where the base station begins receiving data packets from an RNC and PDUs from an access terminal At step 812, the base station decodes the PDUs to ascertain the sequence number corresponding to the data packet requested by the access terminal, and the identification code corresponding to the base station from which the access terminal would like to receive subsequent data packets. In an aspect, the decoding of the PDUs at step 812 is performed concurrently with step 814 where the data packets received from the RNC are sequentially buffered according to their respective sequence numbers. Depending on the buffer size of the particular base station and/or instructions provided by the RNC via configuration, superfluous data packets are then discarded at step 815.

At step 820, the base station then determines whether its own identification code was encoded in the received PDU. If the PDU indeed identified the base station, process 800 would then proceed to step 825 where the base station would begin/continue to transmit data packets to the access terminal. Here, it should be appreciated that the base station will sequentially transmit data packets to the access terminal beginning with the data packet identified in the PDU decoded at step 812, wherein the transmission of data packets at 825 constitutes an implicit handover command to the access terminal (assuming a change in serving cells occurred). Once the data packets have begun to be transmitted at step 825, process 800 loops back to step 810 where the base station continues to receive data packets and PDUs.

However, if at step 820 the base station determines that its identification code was not encoded in the PDU, a determination is made at step 830 as to whether the base station is source base station. If the base station is not a source, process 800 loops back to 810 where the base station continues to receive data packets and PDUs.

If at step 830 it is indeed determined that the base station is a source, process 800 proceeds to step 835 where a determination is then made as to whether an ACK/NACK signals are still being received from the access terminal Such a determination may include determining whether a threshold amount of time has elapsed since the last ACK/NACK signal was received, wherein the threshold value may be provided as part of the configuration performed at step 805. If it is determined that ACK/NACK signals are still being received, the base station assumes that the handover process was not completed and thus continues to transmit data packets at step 825. Otherwise, if it is determined that ACK/NACK signals are no longer being received, process 800 loops back to step 810 where the base station continues to receive data packets and PDUs.

Figure 9:
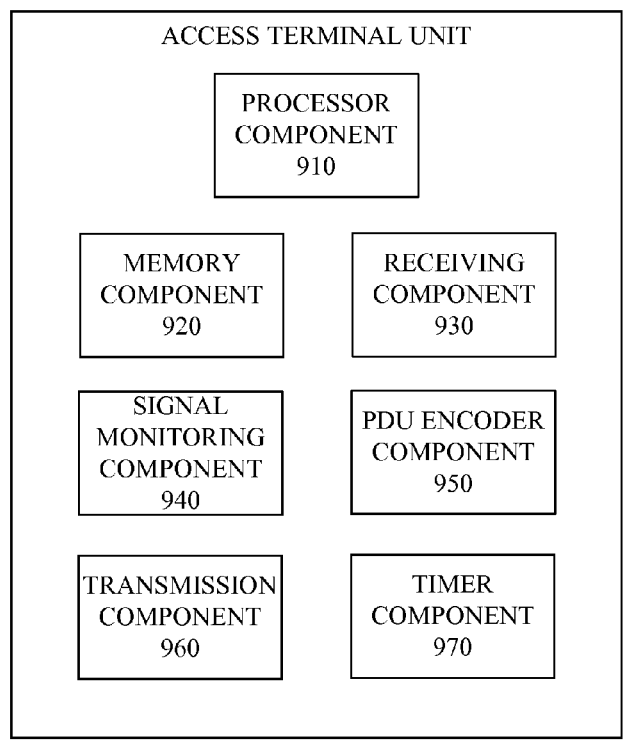
FIG. 9 is a block diagram of an exemplary access terminal unit in accordance with an embodiment.

Referring next to FIG. 9, a block diagram of an exemplary access terminal unit in accordance with an embodiment is provided. As illustrated, access terminal unit 900 may include processor component 910, memory component 920, receiving component 930, signal monitoring component 940, PDU encoder component 950, transmission component 960, and timer component 970.

Similar to processor component 410 in RNC unit 400 and processor component 610 in base station unit 600, processor component 910 is configured to execute computer-readable instructions related to performing any of a plurality of functions. Processor component 910 can be a single processor or a plurality of processors dedicated to analyzing information to be communicated from access terminal unit 900 and/or generating information that can be utilized by memory component 920, receiving component 930, signal monitoring component 940, PDU encoder component 950, transmission component 960, and/or timer component 970. Additionally or alternatively, processor component 910 may be configured to control one or more components of access terminal unit 900.

In another aspect, memory component 920 is coupled to processor component 910 and configured to store computer-readable instructions executed by processor component 910. Memory component 920 may also be configured to store any of a plurality of other types of data including data generated by any of receiving component 930, signal monitoring component 940, PDU encoder component 950, transmission component 960, and/or timer component 970. Here, it should again be noted that memory component 920 is analogous to memory component 420 in RNC unit 400 and memory component 620 in base station unit 600. Accordingly, it should be appreciated that any of the aforementioned features/configurations of memory components 420 and 620 are also applicable to memory component 920.

In an aspect, receiving component 930 and transmission component 940 are coupled to processor component 910 and configured to interface access terminal unit 900 with external entities. For instance, receiving component 930 may be configured to receive configuration data and data packets from a source base station, whereas transmission component 940 may be configured to transmit PDUs to each base station in an active set.

As illustrated, access terminal unit 900 also includes signal monitoring component 940. Within such embodiment, signal monitoring component 940 is configured to monitor signals from the base stations so as to ascertain a relative signal quality for each base station in the active set. Here, it should be noted that signal monitoring component 940 may monitor the base station signals in any of a plurality of ways known in the art, wherein particular monitoring instructions may be provided during the active set update procedure (i.e., via configuration data provided by an RNC). For instance, such instructions may include instructions for continuously/periodically sampling signals from each base station at a particular sampling rate.

Access terminal unit 900 further includes PDU encoder component 950. In an aspect, PDU encoder component 950 is configured to monitor the received data packets so as to ascertain the sequence number of a subsequent data packet to be received. PDU encoder component 950 is also configured to utilize data from signal monitoring component 940 to identify from which base station access terminal unit 900 would like to receive data packets. By identifying a subsequently desired packet and a preferred base station, PDU encoder component 950 may then encode a PDU to include a corresponding sequence number and a corresponding identification code.

Access terminal unit 900 may also include timer component 970. In an aspect, timer component 970 is configured to determine whether a particular handover procedure should be cancelled. Indeed, if a PDU identifying a target base station is not received by the target, access terminal unit 900 will not receive data packets from the target (i.e., access terminal unit 900 will have not received an implicit handover command from the target). To overcome such a predicament, access terminal unit 900 may be pre-configured to cancel a handover procedure if data packets are not received from the target in a timely manner. Within such embodiment, timer component 970 may be utilized to determine whether a threshold amount of time has elapsed before receiving data packets from the target.

Figure 10:
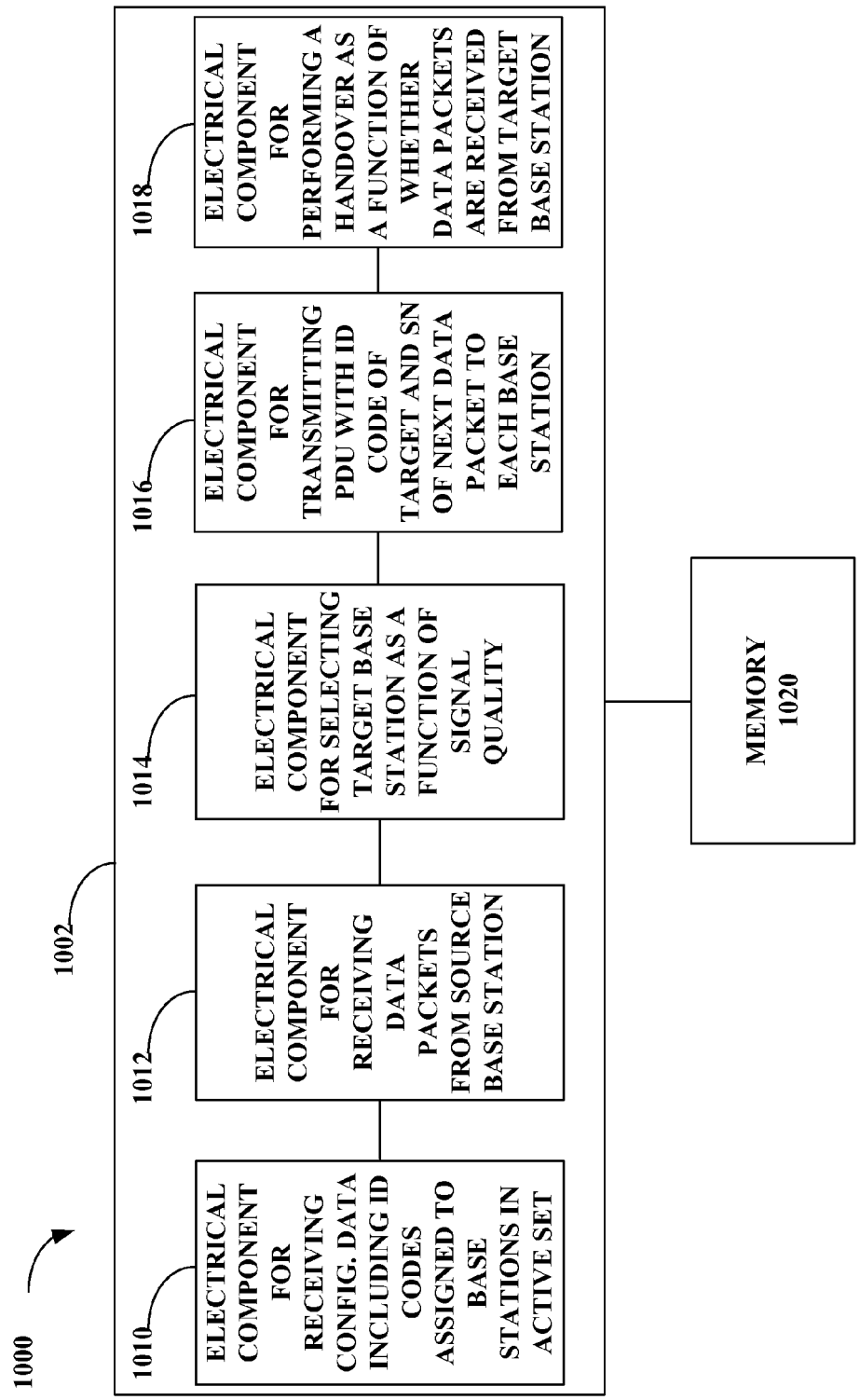
FIG. 10 is an illustration of an exemplary coupling of electrical components that effectuate switching HSPA serving cells from an access terminal.

Referring next to FIG. 10, illustrated is yet another system 1000 that facilitates switching HSPA serving cells in a wireless communication environment. System 1000 can reside within an access terminal, for instance. Similar to systems 500 and 700, system 1000 includes functional blocks that can represent functions implemented by a processor, software, or combination thereof (e.g., firmware), wherein system 1000 includes a logical grouping 1002 of electrical components that can act in conjunction. As illustrated, logical grouping 1002 can include an electrical component for receiving configuration data including identification codes assigned to base stations in an active set 1010, and an electrical component for receiving data packets from a source base station 1012. Further, logical grouping 1002 can include an electrical component for selecting a target base station as a function of signal quality 1014, as well as an electrical component for transmitting to each base station a PDU encoded with the identification code of the target base station and the sequence number of a subsequent data packet 1016. Logical grouping 1002 can also include an electrical component for completing a handover procedure as a function of whether data packets are received from the target base station 1018. Additionally, system 1000 can include a memory 1020 that retains instructions for executing functions associated with electrical components 1010, 1012, 1014, and 1016, wherein any of electrical components 1010, 1012, 1014, and 1016 can exist either within or outside memory 1020.

Figure 11:
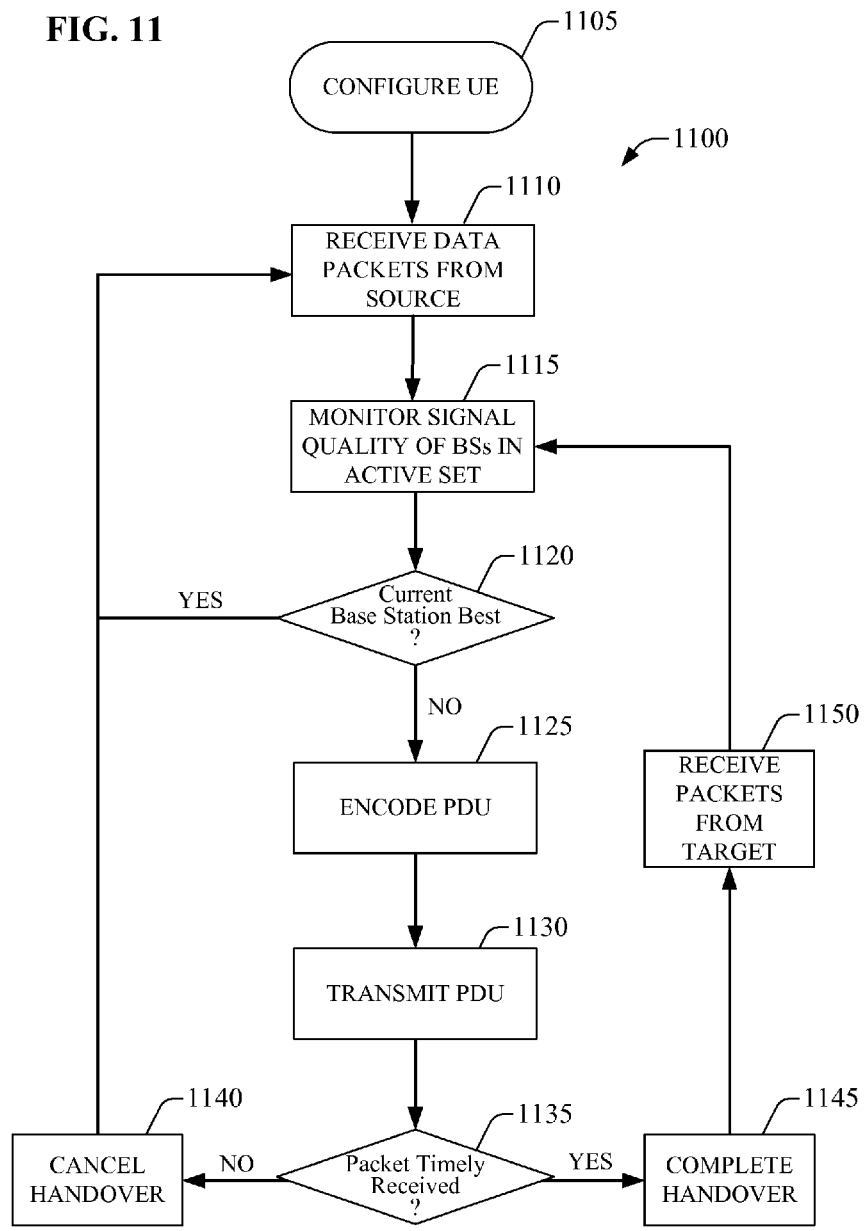
FIG. 11 is a flow chart illustrating an exemplary methodology for facilitating switching HSPA serving cells from an access terminal.

In FIG. 11, a flow chart is provided illustrating an exemplary methodology for facilitating switching HSPA serving cells from an access terminal As illustrated, process 1100 begins at step 1105 where the access terminal is configured for HS-DSCH operation with MAC-FCS. Once configured, the access terminal begins receiving data packets sequentially from a source base station at step 1110, wherein each of the data packets is tagged with a sequence number identifying the data packets' order in the sequence.

Process 1100 continues at step 1115 where the access terminal monitors the signal strength of each base station in the active set. At step 1120, the access terminal then determines whether it is receiving a higher quality signal from the base station of the current serving cell. If the signal quality of the current serving cell is indeed best, process 1100 loops back to step 1110 where the access terminal continues to receive data packets from the source base station.

If the signal quality of the current serving cell is not best, however, process 1100 proceeds to step 1125 where a PDU is encoded. Here, such a PDU would be encoded with the identification code corresponding to the base station with the higher quality signal (i.e., the target base station) and the sequence number corresponding to the next data packet desired by the access terminal The encoded PDU is then transmitted to each base station in the active set at step 1130.

At step 1135, a determination is made as to whether the data packet identified in the PDU is received from the target base station in a timely manner. If a threshold amount of time for receiving the data packet has elapsed, the handover process is cancelled at step 1140 and process 1100 loops back to receiving data packets from the original source at step 1110.

However, if the requested data packet is timely received from the target, the handover is completed at step 1145. At step 1150, process 1100 continues with subsequent data packets being received via the target base station. Process 1100 then loops back to step 1115 where the access terminal continues to monitor the signal strength of each base station in the active set.

Figure 12:
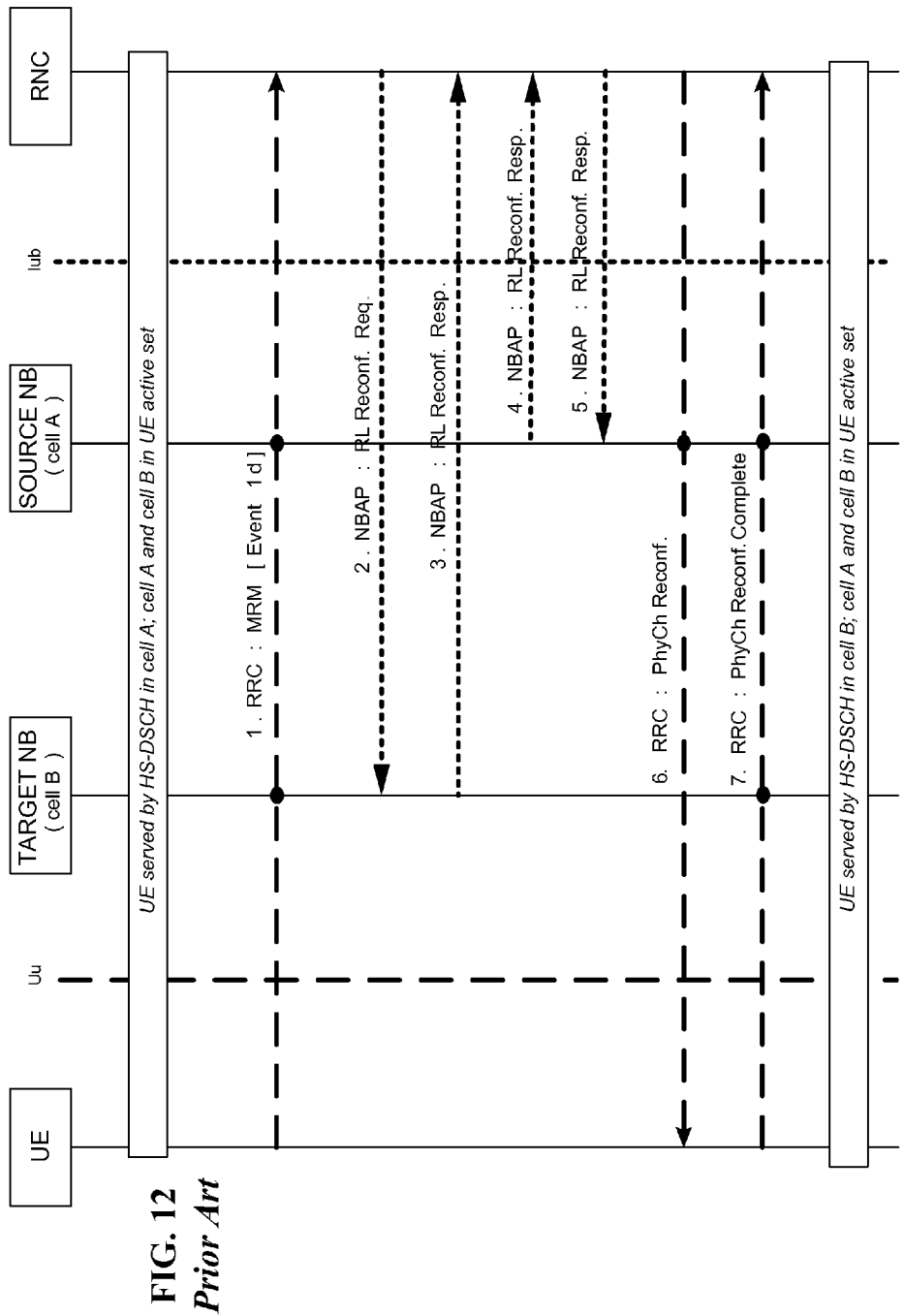
FIG. 12 illustrates an exemplary signal flow of an existing serving cell change procedure.
Figure 13:
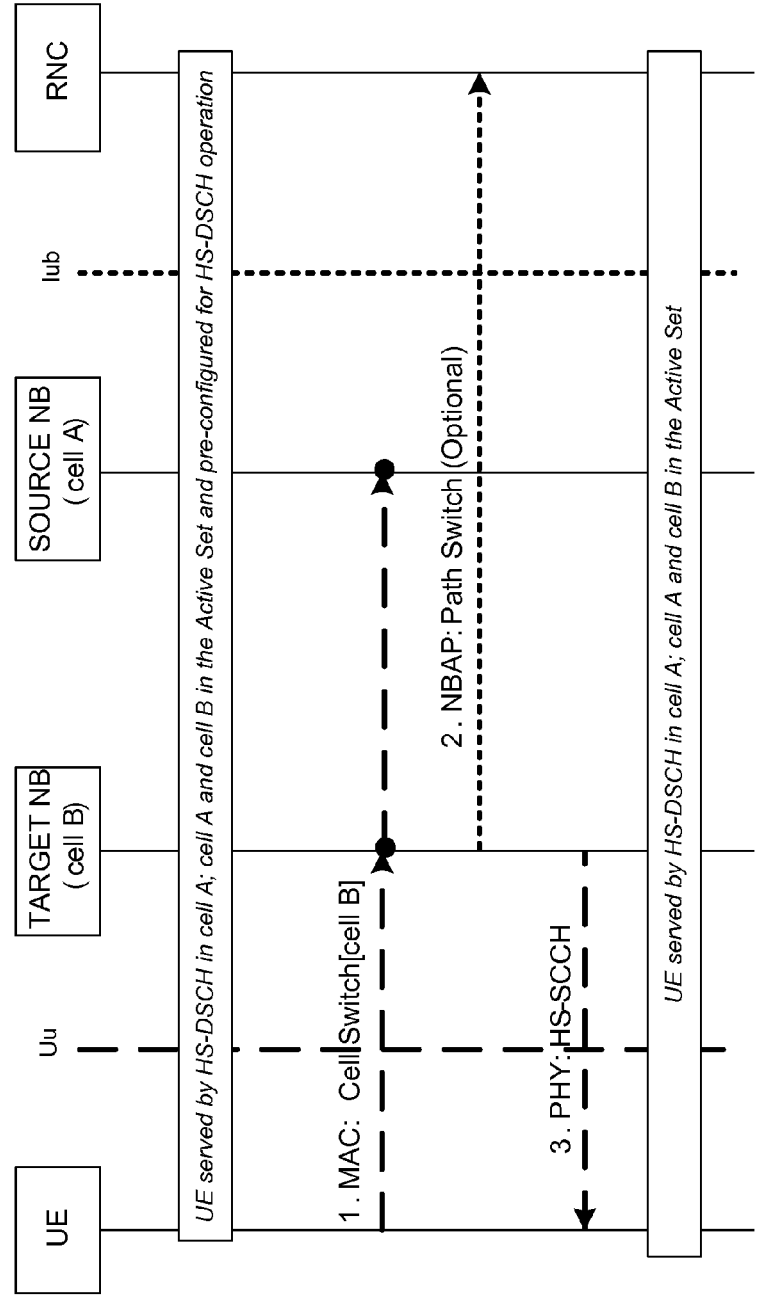
FIG. 13 illustrates an exemplary signal flow of a MAC-based serving cell change procedure according to one embodiment.

Referring next to FIGS. 12-13, exemplary signal flows comparing an existing serving cell change procedure with a MAC-based serving cell change procedure according to a disclosed embodiment are respectively provided. To this end, it should be noted that the signal flow in FIG. 12 corresponds to an existing unsynchronized serving cell procedure. Namely, the procedure illustrated in FIG. 12 is based on the RRC (radio resource control) protocol, which is a primary reason for its high latency (i.e., signal flow needs to circulate through the RNC). This high latency, together with the fact that the handover command (i.e., message 6 in FIG. 12) is delivered from the source cell, have been identified as significant causes for the low reliability of this procedure.

As can be seen by comparing FIG. 12 to FIG. 13, the proposed scheme can greatly reduce the latency (and therefore the reliability) of the HSPA serving cell change procedure. A significant reason for this improved performance is that the termination point of the disclosed MAC-FCS procedure is down in the Node-Bs instead of remaining in the RNC. In theory, an RNC should not even have to know which Node-B in the active set is currently serving a RLC-UM flow of a particular UE.

A brief summary of the proposed scheme is now provided, in light of the signal flow illustrated in FIG. 13. In an aspect, during the active set update procedure, the RNC pre-configures the UE and the cells in the active set for HS-DSCH operation with MAC-FCS (for simplicity, sometimes referred to as MAC-FCS operation). Alternatively, only part of the cells in the active set could be pre-configured for MAC-FCS operation. In such case a MAC-FCS set could be defined as the subset of cells in the active set configured for MAC-FCS operation.

When the signal quality of a non-serving cell in the active set becomes better than the signal quality of the current serving cell, the UE transmits the newly defined Cell Switch MAC Control PDU to request to the network a serving cell change. Here, the target cell is indicated using an active set Cell ID field in the Cell Switch MAC Control PDU, wherein the active set Cell ID indicates a particular cell in the active set. In an aspect, only two bits are needed since the maximum active set size for HSPA is four.

It should also be noted that a new event can be defined into the standard to trigger transmission of the Cell Switch MAC Control PDU. In one embodiment, the event is configurable so that different parameter settings are allowed. For instance, exemplary parameters that may be configured include threshold, filtering, hysteresis, and time-to-trigger. Here, it should be further noted that the reliability of the Cell Switch MAC Control PDU may be improved by boosting the transmission power or by repeating the transmission of the message over the air.

Once a Cell Switch MAC Control PDU has been transmitted, the UE starts to monitor the scheduling channel of the target cell for serving cell change confirmation (i.e., implicit handover command). During this phase, however, the UE continues to receive data from the source cell. The Cell Switch MAC control PDU is decoded by all the cells in the active set. In an aspect, cells in the active set learn their active set-Cell IDs when they are pre-configured for MAC-FCS operation.

For some embodiments, if a target cell successfully decodes the Cell Switch MAC PDU (and thus grants the serving cell change), the target cell may then issue a Path Switch message over Iub to inform the RNC that the UE has switched serving cells. Upon receiving the Path Switch message, the RNC stops downlink data transmission towards the source cell and starts downlink data transmission towards the target cell. The Path Switch message, however, is optional for flows for which the network implements data bi-casting. The step is not optional for all other flows.

Figure 14:
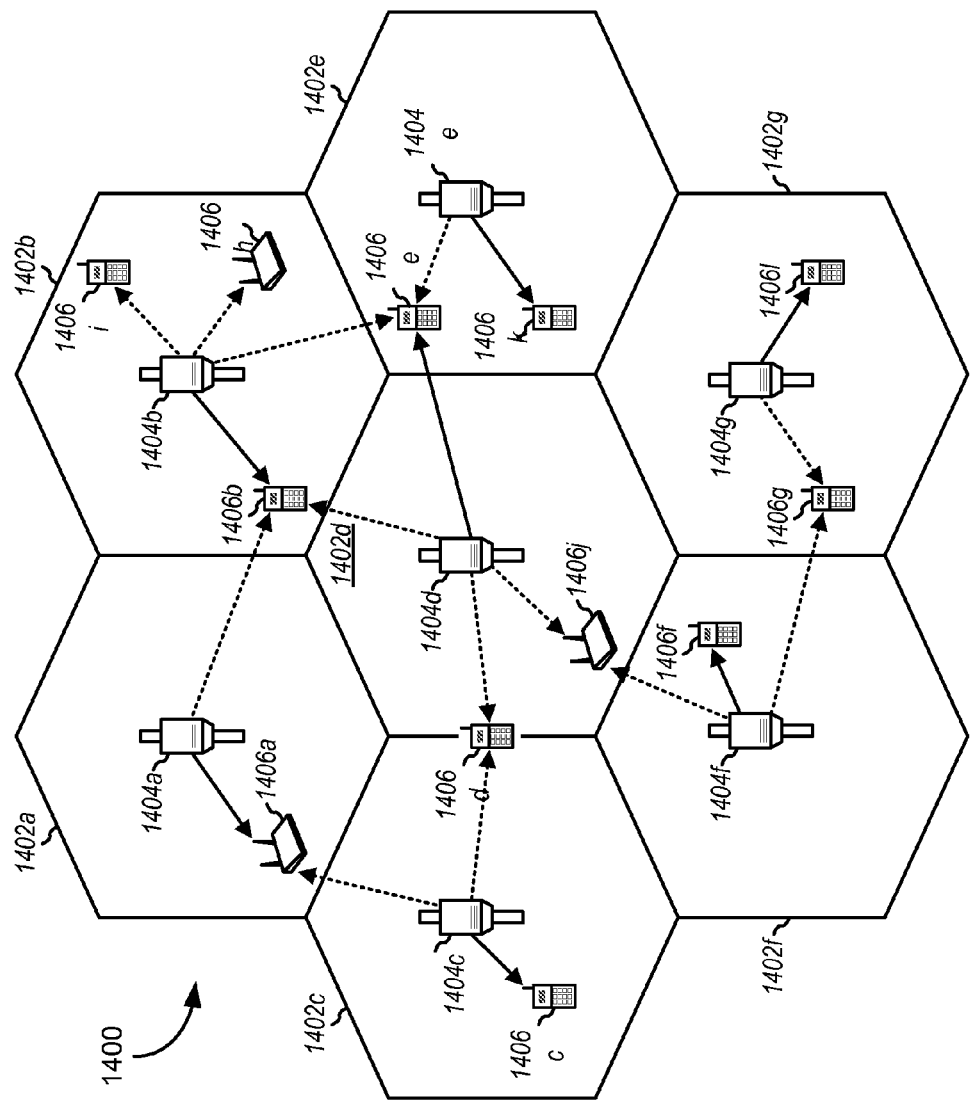
FIG. 14 illustrates an exemplary wireless communication system.

FIG. 14 illustrates an exemplary wireless communication system 1400 configured to support a number of users, in which various disclosed embodiments and aspects may be implemented. As shown in FIG. 14, by way of example, system 1400 provides communication for multiple cells 1402, such as, for example, macro cells 1402a-1402g, with each cell being serviced by a corresponding access point (AP) 1404 (such as APs 1404a-1404g). Each cell may be further divided into one or more sectors. Various access terminals (ATs) 1406, including ATs 1406a-1406k, also known interchangeably as user equipment (UE), are dispersed throughout the system. Each AT 1406 may communicate with one or more APs 1404 on a forward link (FL) and/or a reverse link (RL) at a given moment, depending upon whether the AT is active and whether it is in soft handoff, for example. The wireless communication system 1400 may provide service over a large geographic region, for example, macro cells 1402a-1402g may cover a few blocks in a neighborhood.

Figure 15:
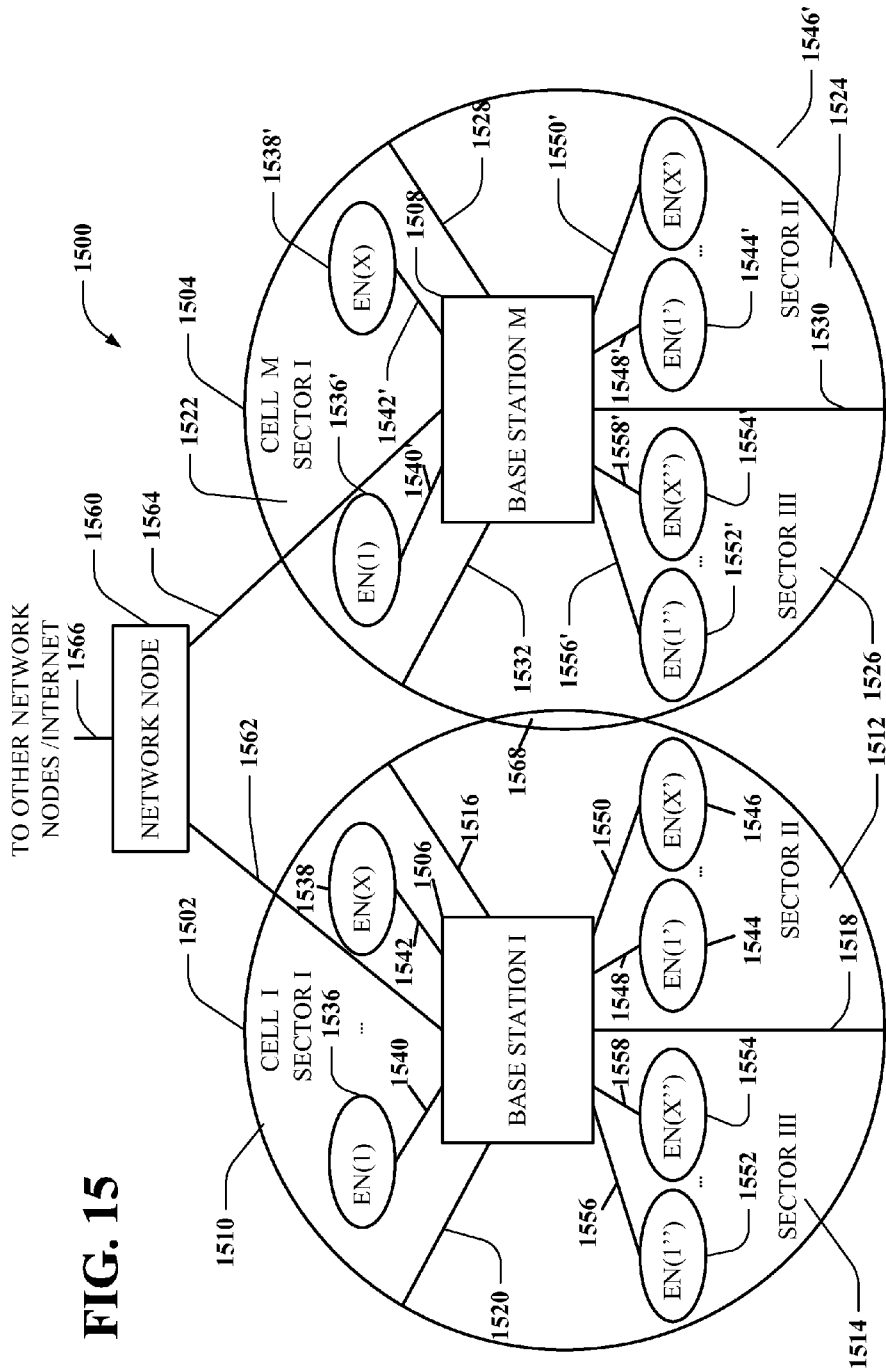
FIG. 15 is an illustration of an exemplary communication system implemented in accordance with various aspects including multiple cells.

Referring next to FIG. 15, an exemplary communication system 1500 implemented in accordance with various aspects is provided including multiple cells: cell I 1502, cell M 1504. Here, it should be noted that neighboring cells 1502, 1504 overlap slightly, as indicated by cell boundary region 1568, thereby creating potential for signal interference between signals transmitted by base stations in neighboring cells. Each cell 1502, 1504 of system 1500 includes three sectors. Cells which have not been subdivided into multiple sectors (N=1), cells with two sectors (N=2) and cells with more than 3 sectors (N>3) are also possible in accordance with various aspects. Cell 1502 includes a first sector, sector I 1510, a second sector, sector II 1512, and a third sector, sector III 1514. Each sector 1510, 1512, 1514 has two sector boundary regions; each boundary region is shared between two adjacent sectors.

Sector boundary regions provide potential for signal interference between signals transmitted by base stations in neighboring sectors. Line 1516 represents a sector boundary region between sector I 1510 and sector II 1512; line 1518 represents a sector boundary region between sector II 1512 and sector III 1514; line 1520 represents a sector boundary region between sector III 1514 and sector 1 1510. Similarly, cell M 1504 includes a first sector, sector I 1522, a second sector, sector II 1524, and a third sector, sector III 1526. Line 1528 represents a sector boundary region between sector I 1522 and sector II 1524; line 1530 represents a sector boundary region between sector II 1524 and sector III 1526; line 1532 represents a boundary region between sector III 1526 and sector I 1522. Cell I 1502 includes a base station (BS), base station I 1506, and a plurality of end nodes (ENs) in each sector 1510, 1512, 1514. Sector I 1510 includes EN(1) 1536 and EN(X) 1538 coupled to BS 1506 via wireless links 1540, 1542, respectively; sector II 1512 includes EN(1') 1544 and EN(X') 1546 coupled to BS 1506 via wireless links 1548, 1550, respectively; sector III 1514 includes EN(1") 1552 and EN(X") 1554 coupled to BS 1506 via wireless links 1556, 1558, respectively. Similarly, cell M 1504 includes base station M 1508, and a plurality of end nodes (ENs) in each sector 1522, 1524, 1526. Sector I 1522 includes EN(1) 1536' and EN(X) 1538' coupled to BS M 1508 via wireless links 1540', 1542', respectively; sector II 1524 includes EN(1') 1544' and EN(X') 1546' coupled to BS M 1508 via wireless links 1548', 1550', respectively; sector 3 1526 includes EN(1") 1552' and EN(X") 1554' coupled to BS 1508 via wireless links 1556', 1558', respectively.

System 1500 also includes a network node 1560 which is coupled to BS I 1506 and BS M 1508 via network links 1562, 1564, respectively. Network node 1560 is also coupled to other network nodes, e.g., other base stations, AAA server nodes, intermediate nodes, routers, etc. and the Internet via network link 1566. Network links 1562, 1564, 1566 may be, e.g., fiber optic cables. Each end node, e.g. EN 1 1536 may be a wireless terminal including a transmitter as well as a receiver. The wireless terminals, e.g., EN(1) 1536 may move through system 1500 and may communicate via wireless links with the base station in the cell in which the EN is currently located. The wireless terminals, (WTs), e.g. EN(1) 1536, may communicate with peer nodes, e.g., other WTs in system 1500 or outside system 1500 via a base station, e.g. BS 1506, and/or network node 1560. WTs, e.g., EN(1) 1536 may be mobile communications devices such as cell phones, personal data assistants with wireless modems, etc. Respective base stations perform tone subset allocation using a different method for the strip-symbol periods, from the method employed for allocating tones and determining tone hopping in the rest symbol periods, e.g., non strip-symbol periods. The wireless terminals use the tone subset allocation method along with information received from the base station, e.g., base station slope ID, sector ID information, to determine tones that they can employ to receive data and information at specific strip-symbol periods. The tone subset allocation sequence is constructed, in accordance with various aspects to spread inter-sector and inter-cell interference across respective tones. Although the subject system was described primarily within the context of cellular mode, it is to be appreciated that a plurality of modes may be available and employable in accordance with aspects described herein.

Figure 16:
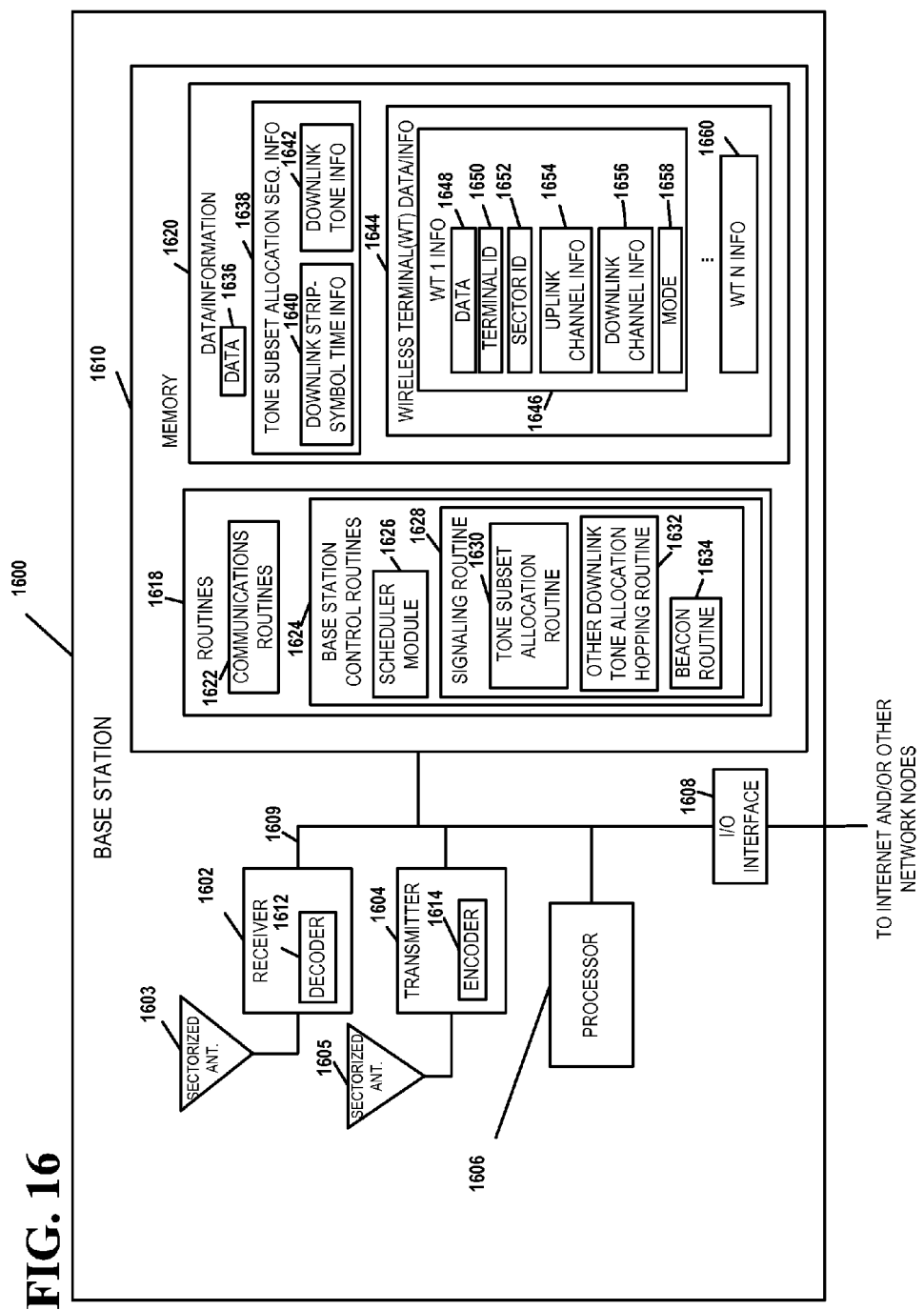
FIG. 16 is an illustration of an exemplary base station in accordance with various aspects described herein.

FIG. 16 illustrates an example base station 1600 in accordance with various aspects. Base station 1600 implements tone subset allocation sequences, with different tone subset allocation sequences generated for respective different sector types of the cell. Base station 1600 may be used as any one of base stations 1506, 1508 of the system 1500 of FIG. 15. The base station 1600 includes a receiver 1602, a transmitter 1604, a processor 1606, e.g., CPU, an input/output interface 1608 and memory 1610 coupled together by a bus 1609 over which various elements 1602, 1604, 1606, 1608, and 1610 may interchange data and information.

Sectorized antenna 1603 coupled to receiver 1602 is used for receiving data and other signals, e.g., channel reports, from wireless terminals transmissions from each sector within the base station's cell. Sectorized antenna 1605 coupled to transmitter 1604 is used for transmitting data and other signals, e.g., control signals, pilot signal, beacon signals, etc. to wireless terminals 1700 (see FIG. 17) within each sector of the base station's cell. In various aspects, base station 1600 may employ multiple receivers 1602 and multiple transmitters 1604, e.g., an individual receivers 1602 for each sector and an individual transmitter 1604 for each sector. Processor 1606, may be, e.g., a general purpose central processing unit (CPU). Processor 1606 controls operation of base station 1600 under direction of one or more routines 1618 stored in memory 1610 and implements the methods. I/O interface 1608 provides a connection to other network nodes, coupling the BS 1600 to other base stations, access routers, AAA server nodes, etc., other networks, and the Internet. Memory 1610 includes routines 1618 and data/information 1620.

Data/information 1620 includes data 1636, tone subset allocation sequence information 1638 including downlink strip-symbol time information 1640 and downlink tone information 1642, and wireless terminal (WT) data/info 1644 including a plurality of sets of WT information: WT 1 info 1646 and WT N info 1660. Each set of WT info, e.g., WT 1 info 1646 includes data 1648, terminal ID 1650, sector ID 1652, uplink channel information 1654, downlink channel information 1656, and mode information 1658.

Routines 1618 include communications routines 1622 and base station control routines 1624. Base station control routines 1624 includes a scheduler module 1626 and signaling routines 1628 including a tone subset allocation routine 1630 for strip-symbol periods, other downlink tone allocation hopping routine 1632 for the rest of symbol periods, e.g., non strip-symbol periods, and a beacon routine 1634.

Data 1636 includes data to be transmitted that will be sent to encoder 1614 of transmitter 1604 for encoding prior to transmission to WTs, and received data from WTs that has been processed through decoder 1612 of receiver 1602 following reception. Downlink strip-symbol time information 1640 includes the frame synchronization structure information, such as the superslot, beaconslot, and ultraslot structure information and information specifying whether a given symbol period is a strip-symbol period, and if so, the index of the strip-symbol period and whether the strip-symbol is a resetting point to truncate the tone subset allocation sequence used by the base station. Downlink tone information 1642 includes information including a carrier frequency assigned to the base station 1600, the number and frequency of tones, and the set of tone subsets to be allocated to the strip-symbol periods, and other cell and sector specific values such as slope, slope index and sector type.

Data 1648 may include data that WT1 1700 has received from a peer node, data that WT 1 1700 desires to be transmitted to a peer node, and downlink channel quality report feedback information. Terminal ID 1650 is a base station 1600 assigned ID that identifies WT 1 1700. Sector ID 1652 includes information identifying the sector in which WT1 1700 is operating. Sector ID 1652 can be used, for example, to determine the sector type. Uplink channel information 1654 includes information identifying channel segments that have been allocated by scheduler 1626 for WT1 1700 to use, e.g., uplink traffic channel segments for data, dedicated uplink control channels for requests, power control, timing control, etc. Each uplink channel assigned to WT1 1700 includes one or more logical tones, each logical tone following an uplink hopping sequence. Downlink channel information 1656 includes information identifying channel segments that have been allocated by scheduler 1626 to carry data and/or information to WT1 1700, e.g., downlink traffic channel segments for user data. Each downlink channel assigned to WT1 1700 includes one or more logical tones, each following a downlink hopping sequence. Mode information 1658 includes information identifying the state of operation of WT1 1700, e.g. sleep, hold, on.

Communications routines 1622 control the base station 1600 to perform various communications operations and implement various communications protocols. Base station control routines 1624 are used to control the base station 1600 to perform basic base station functional tasks, e.g., signal generation and reception, scheduling, and to implement the steps of the method of some aspects including transmitting signals to wireless terminals using the tone subset allocation sequences during the strip-symbol periods.

Signaling routine 1628 controls the operation of receiver 1602 with its decoder 1612 and transmitter 1604 with its encoder 1614. The signaling routine 1628 is responsible controlling the generation of transmitted data 1636 and control information. Tone subset allocation routine 1630 constructs the tone subset to be used in a strip-symbol period using the method of the aspect and using data/info 1620 including downlink strip-symbol time info 1640 and sector ID 1652. The downlink tone subset allocation sequences will be different for each sector type in a cell and different for adjacent cells. The WTs 1700 receive the signals in the strip-symbol periods in accordance with the downlink tone subset allocation sequences; the base station 1600 uses the same downlink tone subset allocation sequences in order to generate the transmitted signals. Other downlink tone allocation hopping routine 1632 constructs downlink tone hopping sequences, using information including downlink tone information 1642, and downlink channel information 1656, for the symbol periods other than the strip-symbol periods. The downlink data tone hopping sequences are synchronized across the sectors of a cell. Beacon routine 1634 controls the transmission of a beacon signal, e.g., a signal of relatively high power signal concentrated on one or a few tones, which may be used for synchronization purposes, e.g., to synchronize the frame timing structure of the downlink signal and therefore the tone subset allocation sequence with respect to an ultra-slot boundary.

Figure 17:
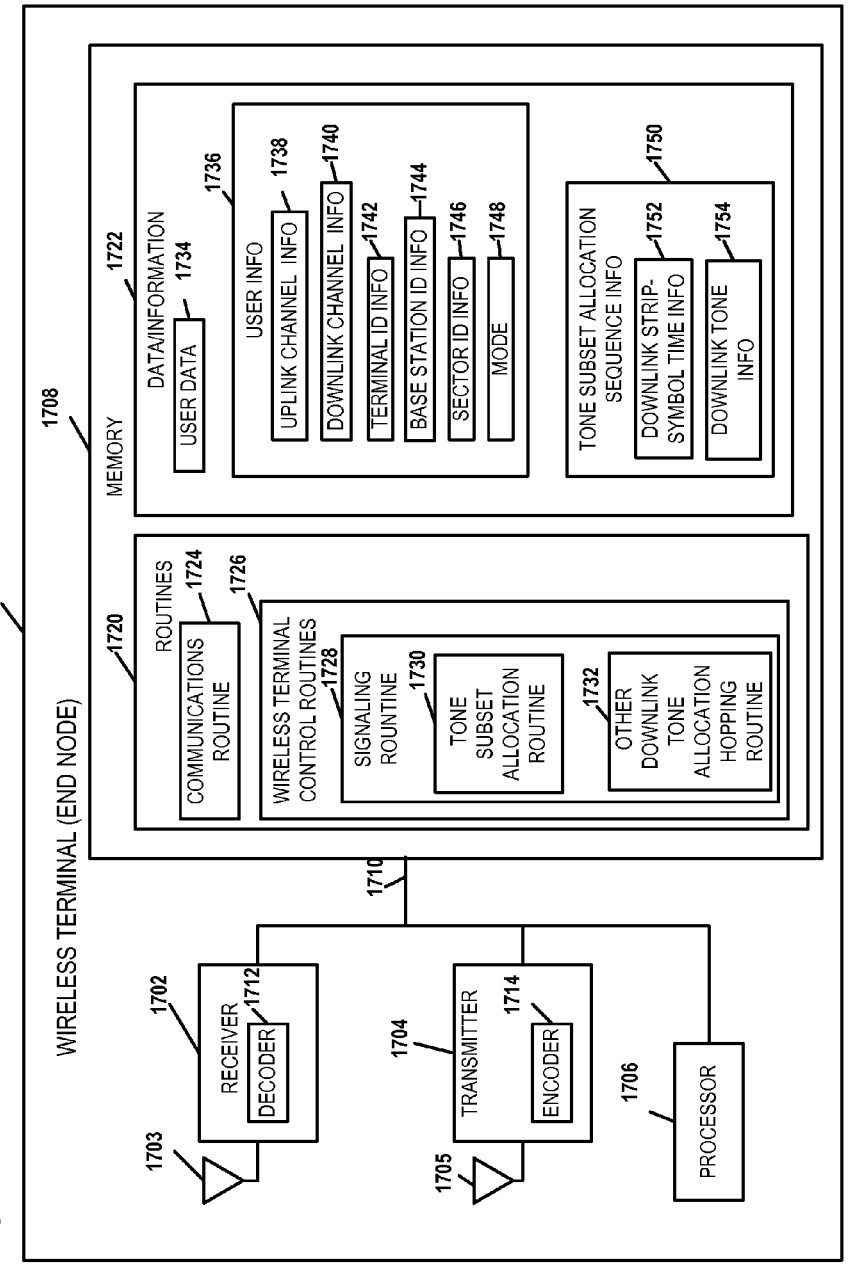
FIG. 17 is an illustration of an exemplary wireless terminal implemented in accordance with various aspects described herein.

FIG. 17 illustrates an example wireless terminal (end node) 1700 which can be used as any one of the wireless terminals (end nodes), e.g., EN(1) 1536, of the system 1500 shown in FIG. 15. Wireless terminal 1700 implements the tone subset allocation sequences. The wireless terminal 1700 includes a receiver 1702 including a decoder 1712, a transmitter 1704 including an encoder 1714, a processor 1706, and memory 1708 which are coupled together by a bus 1710 over which the various elements 1702, 1704, 1706, 1708 can interchange data and information. An antenna 1703 used for receiving signals from a base station (and/or a disparate wireless terminal) is coupled to receiver 1702. An antenna 1705 used for transmitting signals, e.g., to a base station (and/or a disparate wireless terminal) is coupled to transmitter 1704.

The processor 1706, e.g., a CPU controls the operation of the wireless terminal 1700 and implements methods by executing routines 1720 and using data/information 1722 in memory 1708.

Data/information 1722 includes user data 1734, user information 1736, and tone subset allocation sequence information 1750. User data 1734 may include data, intended for a peer node, which will be routed to encoder 1714 for encoding prior to transmission by transmitter 1704 to a base station, and data received from the base station which has been processed by the decoder 1712 in receiver 1702. User information 1736 includes uplink channel information 1738, downlink channel information 1740, terminal ID information 1742, base station ID information 1744, sector ID information 1746, and mode information 1748. Uplink channel information 1738 includes information identifying uplink channels segments that have been assigned by a base station for wireless terminal 1700 to use when transmitting to the base station. Uplink channels may include uplink traffic channels, dedicated uplink control channels, e.g., request channels, power control channels and timing control channels. Each uplink channel includes one or more logic tones, each logical tone following an uplink tone hopping sequence. The uplink hopping sequences are different between each sector type of a cell and between adjacent cells. Downlink channel information 1740 includes information identifying downlink channel segments that have been assigned by a base station to WT 1700 for use when the base station is transmitting data/information to WT 1700. Downlink channels may include downlink traffic channels and assignment channels, each downlink channel including one or more logical tone, each logical tone following a downlink hopping sequence, which is synchronized between each sector of the cell.

User info 1736 also includes terminal ID information 1742, which is a base station-assigned identification, base station ID information 1744 which identifies the specific base station that WT has established communications with, and sector ID info 1746 which identifies the specific sector of the cell where WT 1700 is presently located. Base station ID 1744 provides a cell slope value and sector ID info 1746 provides a sector index type; the cell slope value and sector index type may be used to derive tone hopping sequences. Mode information 1748 also included in user info 1736 identifies whether the WT 1700 is in sleep mode, hold mode, or on mode.

Tone subset allocation sequence information 1750 includes downlink strip-symbol time information 1752 and downlink tone information 1754. Downlink strip-symbol time information 1752 include the frame synchronization structure information, such as the superslot, beaconslot, and ultraslot structure information and information specifying whether a given symbol period is a strip-symbol period, and if so, the index of the strip-symbol period and whether the strip-symbol is a resetting point to truncate the tone subset allocation sequence used by the base station. Downlink tone info 1754 includes information including a carrier frequency assigned to the base station, the number and frequency of tones, and the set of tone subsets to be allocated to the strip-symbol periods, and other cell and sector specific values such as slope, slope index and sector type.

Routines 1720 include communications routines 1724 and wireless terminal control routines 1726. Communications routines 1724 control the various communications protocols used by WT 1700. Wireless terminal control routines 1726 controls basic wireless terminal 1700 functionality including the control of the receiver 1702 and transmitter 1704. Wireless terminal control routines 1726 include the signaling routine 1728. The signaling routine 1728 includes a tone subset allocation routine 1730 for the strip-symbol periods and an other downlink tone allocation hopping routine 1732 for the rest of symbol periods, e.g., non strip-symbol periods. Tone subset allocation routine 1730 uses user data/info 1722 including downlink channel information 1740, base station ID info 1744, e.g., slope index and sector type, and downlink tone information 1754 in order to generate the downlink tone subset allocation sequences in accordance with some aspects and process received data transmitted from the base station. Other downlink tone allocation hopping routine 1730 constructs downlink tone hopping sequences, using information including downlink tone information 1754, and downlink channel information 1740, for the symbol periods other than the strip-symbol periods. Tone subset allocation routine 1730, when executed by processor 1706, is used to determine when and on which tones the wireless terminal 1700 is to receive one or more strip-symbol signals from the base station 1500. The uplink tone allocation hopping routine 1730 uses a tone subset allocation function, along with information received from the base station, to determine the tones in which it should transmit on.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

When the embodiments are implemented in program code or code segments, it should be appreciated that a code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc. Additionally, in some aspects, the steps and/or actions of a method or algorithm can reside as one or any combination or set of codes and/or instructions on a machine readable medium and/or computer readable medium, which can be incorporated into a computer program product.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Furthermore, as used in this application, the terms "component," "module," "system," and the like are intended to refer to a computer-related entity, either hardware, firmware, a combination of hardware and software, software, or software in execution. For example, a component can be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

What is claimed is:

1. A method for an access terminal in a wireless network to facilitate switching HSPA (high speed packet access) serving cells, comprising:
    receiving configuration data, the configuration data including a set of identification codes, each of the identification codes assigned to one of a plurality of base stations in an active set, wherein the configuration data includes data that pre-configures the access terminal for HS-DSCH (high speed downlink shared channel) operation, and wherein the data that pre-configures the access terminal for HS-DSCH comprises the set of identification codes, instructions for determining a signal quality of a base station, and instructions for completing a handover;
    receiving a first set of data packets sequentially from a source base station, the source base station included in the plurality of base stations, the first set of data packets being a subset of a series of data packets, wherein each of the series of data packets includes a sequence number;
    selecting a target base station from the plurality of base stations as a function of a signal quality ascertained for each of the plurality of base stations;
    transmitting a PDU (protocol data unit) to each of the plurality of base stations, the PDU encoded with an identification code corresponding to the target base station and a sequence number corresponding to a subsequent data packet; and
    performing a handover as a function of whether a second set of data packets is received from the target base station, the second set of data packets being a subset of the series of data packets, wherein the second set of packets begins with the subsequent data packet.

2. The method of claim 1, the selecting comprising continuously sampling signals received from each of the plurality of base stations.

3. The method of claim 1, the selecting comprising periodically sampling signals received from each of the plurality of base stations.

4. The method of claim 1, the selecting comprising sampling signals received from each of the plurality of base stations according to instructions provided as part of the configuration data.

5. The method of claim 1, the performing comprising ascertaining whether a threshold amount of time has elapsed since the PDU has been transmitted, wherein the handover is cancelled if the subsequent packet is not received before the threshold amount of time has elapsed.

6. The method of claim 5, the configuration data including instructions for determining the threshold amount of time.

7. The method of claim 1, wherein the transmitting comprises transmitting the PDU in response to a triggering event.

8. The method of claim 7, wherein the triggering event is configurable based on one or more adjustable parameters.

9. The method of claim 8, wherein the parameters include threshold, filtering, hysteresis, and/or time-to-trigger parameter.

10. The method of claim 1, wherein the transmitting comprises transmitting the PDU at an increased transmission power.

11. The method of claim 1, further comprising repeating the transmitting at least once prior to the performing.

12. The method of claim 1, wherein the instructions for determining the signal quality of a base station comprise instructions for continuously or periodically sampling signals from the base station.

13. The method of claim 1, wherein the instructions for completing a handover comprise a time threshold for cancelling a handover procedure.

14. The method of claim 1, wherein the data that pre-configures the access terminal for HS-DSCH differs from configuration data received by each of the plurality of base stations that pre-configures each of the plurality of base stations for HS-DSCH.

15. The method of claim 14, wherein the configuration data received by one base station of the plurality of base stations that pre-configures the one base station for HS-DSCH includes an identification code assigned to the one base station and instructions for discarding data packets.

16. The method of claim 15, wherein the instructions for discarding data packets comprise instructions for discarding data packets already received by the access terminal.

17. The method of claim 14, wherein the plurality of base stations receives the configuration data from a radio network controller.

18. An access terminal for facilitating switching HSPA (high speed packet access) serving cells within a wireless environment, comprising:
    a memory component configured to store computer-readable instructions;
    a processing component coupled to the memory component and configured to execute the computer-readable instructions, the instructions including instructions for implementing a plurality of acts on the following components:
    a receiving component configured to receive configuration data and a first set of data packets, wherein the configuration data includes a set of identification codes, each of the identification codes assigned to one of a plurality of base stations in an active set, wherein the configuration data includes data that pre-configures the access terminal for HS-DSCH (high speed downlink shared channel) operation, wherein the data that pre-configures the access terminal for HS-DSCH comprises the set of identification codes, instructions for determining a signal quality of a base station, and instructions for completing a handover, and wherein the first set of data packets are sequentially received from a source base station, the source base station included in the plurality of base stations, the first set of data packets being a subset of a series of data packets in which each of the series of data packets includes a sequence number;

a signal monitoring component configured to ascertain a signal quality from each of the plurality of base stations and to select a target base station as a function of the ascertained signal qualities;

a PDU (protocol data unit) encoding component configured to encode a PDU with an identification code corresponding to the target base station and a sequence number corresponding to a subsequent data packet; and a transmitting component configured to transmit the PDU to each of the plurality of base stations so as to initiate a handover process, the handover process completed as a function of whether a second set of data packets is received from the target base station, the second set of data packets being a subset of the series of data packets, wherein the second set of packets begins with the subsequent data packet.

19. The access terminal of claim 18, the signal monitoring component configured to continuously sample signals received from each of the plurality of base stations.

20. The access terminal of claim 18, the signal monitoring component configured to periodically sample signals received from each of the plurality of base stations.

21. The access terminal of claim 18, the signal monitoring component configured to sample signals received from each of the plurality of base stations according to instructions provided as part of the configuration data.

22. The access terminal of claim 18 further comprising a timing component configured to ascertain whether a threshold amount of time has elapsed since the PDU has been transmitted, wherein the handover process is cancelled if the subsequent packet is not received before the threshold amount of time has elapsed.

23. The access terminal of claim 22, the configuration data including instructions for determining the threshold amount of time.

24. The access terminal of claim 18, wherein the transmitting component is configured to transmit the PDU in response to a triggering event.

25. The access terminal of claim 24, wherein the triggering event is configurable based on one or more adjustable parameters.

26. The access terminal of claim 25, wherein the parameters include threshold, filtering, hysteresis, and/or time-to-trigger parameters.

27. The access terminal of claim 18, wherein the transmitting component is configured to transmit the PDU at an increased transmission power.

28. The access terminal of claim 18, wherein the transmitting component is further configured to repeat transmitting the PDU at least once prior to initiating the handover process.

29. A non-transitory computer-readable storage medium for facilitating switching HSPA (high speed packet access) serving cells from an access terminal, comprising:

code for receiving configuration data, the configuration data including a set of identification codes, each of the identification codes assigned to one of a plurality of base stations in an active set, wherein the configuration data includes data that pre-configures the access terminal for HS-DSCH (high speed downlink shared channel) operation, and wherein the data that pre-configures the access terminal for HS-DSCH comprises the set of identification codes, instructions for determining a signal quality of a base station, and instructions for completing a handover;

code for receiving a first set of data packets sequentially from a source base station, the source base station included in the plurality of base stations, the first set of data packets being a subset of a series of data packets, wherein each of the series of data packets includes a sequence number;

code for selecting a target base station from the plurality of base stations as a function of a signal quality ascertained for each of the plurality of base stations;

code for transmitting a PDU (protocol data unit) to each of the plurality of base stations, the PDU encoded with an identification code corresponding to the target base station and a sequence number corresponding to a subsequent data packet; and code for performing a handover as a function of whether a second set of data packets is received from the target base station, the second set of data packets being a subset of the series of data packets, wherein the second set of packets begins with the subsequent data packet.

30. An apparatus for facilitating switching HSPA (high speed packet access) serving cells from an access terminal, comprising:

means for receiving configuration data, the configuration data including a set of identification codes, each of the identification codes assigned to one of a plurality of base stations in an active set, wherein the configuration data includes data that pre-configures the access terminal for HS-DSCH (high speed downlink shared channel) operation, and wherein the data that pre-configures the access terminal for HS-DSCH comprises the set of identification codes, instructions for determining a signal quality of a base station, and instructions for completing a handover;

means for receiving a first set of data packets sequentially from a source base station, the source base station included in the plurality of base stations, the first set of data packets being a subset of a series of data packets, wherein each of the series of data packets includes a sequence number;

means for selecting a target base station from the plurality of base stations as a function of a signal quality ascertained for each of the plurality of base stations;

means for transmitting a PDU (protocol data unit) to each of the plurality of base stations, the PDU encoded with an identification code corresponding to the target base station and a sequence number corresponding to a subsequent data packet; and means for performing a handover as a function of whether a second set of data packets is received from the target base station, the second set of data packets being a subset of the series of data packets, wherein the second set of packets begins with the subsequent data packet.

* * * * *